US006887578B2

(12) United States Patent
Gleason et al.

(10) Patent No.: US 6,887,578 B2
(45) Date of Patent: May 3, 2005

(54) FLUOROCARBON-ORGANOSILICON COPOLYMERS AND COATINGS PREPARED BY HOT-FILAMENT CHEMICAL VAPOR DEPOSITION

(75) Inventors: Karen K. Gleason, Lexington, MA (US); Shashi K. Murthy, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/282,905

(22) Filed: Oct. 29, 2002

(65) Prior Publication Data

US 2003/0138645 A1 Jul. 24, 2003

Related U.S. Application Data

(60) Provisional application No. 60/340,911, filed on Oct. 30, 2001.

(51) Int. Cl.[7] .............................................. B32B 25/20
(52) U.S. Cl. ...................... 428/447; 427/588; 427/592; 427/249; 427/255.2; 427/255.6; 427/255.7; 428/421; 428/500; 428/377; 428/373; 428/374
(58) Field of Search ................................ 427/588, 592, 427/249, 255.2, 255.6, 255.7; 428/447, 421, 500, 377, 373, 374, 364

(56) References Cited

U.S. PATENT DOCUMENTS

| | | | |
|---|---|---|---|
| 3,576,387 A | * | 4/1971 | Derby |
| 4,596,761 A | * | 6/1986 | Brault |
| 4,782,380 A | | 11/1988 | Shankar et al. ............... 357/71 |
| 5,079,038 A | | 1/1992 | Rye .......................... 427/248.1 |
| 5,094,895 A | | 3/1992 | Branca et al. ........... 428/36.91 |
| 5,112,649 A | | 5/1992 | Bringmann et al. ........ 427/249 |
| 5,112,775 A | | 5/1992 | Lida et al. .................... 437/225 |
| 5,147,687 A | | 9/1992 | Garg et al. .................. 427/249 |
| 5,160,544 A | | 11/1992 | Garg et al. .................. 118/724 |
| 5,183,545 A | | 2/1993 | Branca et al. ............... 204/252 |
| 5,516,554 A | | 5/1996 | Gasworth .................... 427/249 |
| 5,516,561 A | | 5/1996 | Thomas ....................... 427/490 |
| 5,589,233 A | | 12/1996 | Law et al. ................... 427/579 |
| 5,702,387 A | * | 12/1997 | Arts et al. |
| 5,773,098 A | | 6/1998 | Thomas ....................... 427/490 |
| 5,804,259 A | | 9/1998 | Robles ........................ 427/577 |
| 5,888,591 A | | 3/1999 | Gleason et al. ............. 427/522 |
| 5,939,140 A | | 8/1999 | Oji et al. ..................... 427/249 |
| 6,045,877 A | * | 4/2000 | Gleason et al. |
| 6,051,321 A | | 4/2000 | Lee et al. .................... 428/447 |
| 6,086,952 A | | 7/2000 | Lang et al. ............. 427/255.29 |
| 6,153,269 A | | 11/2000 | Gleason et al. ............. 427/490 |
| 6,156,435 A | | 12/2000 | Gleason et al. ............. 428/422 |
| 6,211,065 B1 | | 4/2001 | Xi et al. ...................... 438/627 |
| 6,228,477 B1 | | 5/2001 | Klare et al. ............... 428/315.5 |
| 6,273,271 B1 | | 8/2001 | Moya ......................... 210/490 |
| 6,274,043 B1 | | 8/2001 | Newman et al. ....... 210/500.36 |
| 6,432,206 B1 | | 8/2002 | Tolt ............................ 118/724 |
| 2001/0018096 A1 | | 8/2001 | Klare ....................... 427/385.5 |

OTHER PUBLICATIONS

Finstenwalder and Hambitzer; "Proton Conductive Thin Films Prepared by Plasma Polymerization", Journal of Membrane Science, 185: 105–124, (2001).
Kim et al.; "Asymmetric Membranes by a Two–Stage Gelation Technique for Gas Separation: Formation and Characterization", Journal of Membrane Science, 161: 229–238,(1999).
Lau, S. K. K.; "Variable Angle Spectroscopic Ellipsometry of Fluorocarbon Films From Hot Filament Chemical Vapor Deposition", J. Vac. Sci. Technol. A 18(5): 2404–2411,(Sep./Oct. 2000).
Lau and Gleason; "Thermal Annealing of Fluorocarbon Films Grown by Hot Filament Chemical Deposition", J. Phys. Chem. B., 105: 2303–2307, (2001).
Lau et al.; "Structure and Morphology Fluorocarbon Films Grown by Hot Filament Chemical Vapor Deposition", Chemical Mater 12: 3032–3037, ( 2000).
Lee and lam; "Pressure Effect on Diamond Nucleation in a Hot–Filament CVD System", Physical Review B, 55(23): 15937–15941, (Jun. 15, 1997).
Lewis et al.; "Hot–Filament Chemical Vapor Deposition of Organosilicon Thin Films from Hexamethycyclotrisiloxane and Octamethylcyclotetrasiloxane", Journal of Electrochemical Society 148(12): F212–F220, (2001).
Lewis et al.; "Perfluorooctane Sulfonyl Fluoride as an Initiator in Hot–Filament Chemical Vapor Deposition of Fluorocarbon Thin Films", Langmuir 17: 7652–7655, ( 2001).
Lewis et al.; "E–Beam Patterning of Hot–Filament CVD Fluorocarbon Films Using Supercritical $CO_2$ as a Developer", Chemical Vapor Deposition, 7(5): 195–197, (2001).
Lau et al.; "Hot–Wire Chemical Vapor Deposition (HWCVD) of Fluorocarbon and Organosilicon Thin Films", Thin Solid Films, 395: 288–291, (2001).
Lewis et al.; "Pulsed–PECVD Films from Hexamethylcyclotriciloxane for Use as Insulating Biomaterials", Chem. Mater. 12: 3488–3494, (2000).
International Search Report Completed on Mar. 2, 2003 and Mailed on Mar. 18, 2003.

* cited by examiner

*Primary Examiner*—Kuo-Liangf Peng
(74) *Attorney, Agent, or Firm*—Dana M. Gordon; Foley Hoag LLP

(57) ABSTRACT

Hot-filament chemical vapor deposition has been used to deposit copolymer thin films consisting of fluorocarbon and siloxane groups. The presence of covalent bonds between the fluorocarbon and organosilicon moieties in the thin film has been confirmed by Infrared, X-ray Photoelectron (XPS) and solid-state $^{29}Si$, $^{19}F$, and $^{13}C$ Nuclear Magnetic Resonance (NMR) spectroscopy. The film structure consists of chains with linear and cyclic siloxane groups and $CF_2$ groups as repeat units.

53 Claims, 17 Drawing Sheets

FLUOROCARBON-ORGANOSILICON COPOLYMERS AND COATINGS PREPARED BY HOT-FILAMENT CHEMICAL VAPOR DEPOSITION

RELATED APPLICATIONS

This application claims the benefit of priority to U.S. Provisional Patent Application Ser. No. 60/340,911, filed Oct. 30, 2001.

GOVERNMENT SUPPORT

This invention was made with support provided by the National Institutes of Health (Contract NO1-NS-9-2323); therefore, the government has certain rights in the invention.

BACKGROUND OF THE INVENTION

Fluorocarbon and organosilicon thin films produced by chemical vapor deposition have a wide variety of applications, ranging from biocompatible coatings for medical implants, to low K dielectrics in integrated circuits. Noort, R. V, Black, M. M. *Biocompatibility of Clinical Implant Materials*; Williams, D. F. Ed.; CRC Press: Boca Raton, 1981; Vol. 2, p 79–98; Chawla, A. S. *Artif. Organs* 1979, 3, 92; Chawla, A. S. *Biomaterials* 1981, 2, 83; Ocumpaugh, D. E., Lee, H. L., *Biomedical Polymers*; Rembaum, A., Shen, M., Eds.; Marcel Dekker: New York, 1971; p 101; Thomson, L. A., Law, F. C., James, K. H., Rushton, N. *Biomaterials* 1991, 12, 781; Guidoin, R., Chakfe, N., Maurel, S., How, T., Batt, M., Marois, M., Gosselin, C. *Biomaterials* 1993, 14, 678; and Lau, K. K. S., Gleason, K. K. *Mater. Res. Soc. Symp. Proc.* 1999, 544, 209; Rosenmayer, T., Huey, W. *Mater. Res. Soc. Symp. Proc.* 1996, 427, 463; Peters, L. *Semicond. Int.* 2000, 23, 108; Loboda, M. J. *Microelect. Eng.* 2000, 50, 15; and Grill, A., Patel, V. *J. Appl. Phys.* 1999, 85, 3314. Fluorocarbon films have been found to be biocompatible and have low dielectric constants. However, they also have a high degree of roughness and do not adhere well to silicon substrates. Silicone films are biocompatible and offer the additional advantages of excellent adhesion to silicon substrates and superior thermal stability. But the dielectric constant of these films is higher than that of the fluorocarbon films. A fluorocarbon-organosilicon copolymer film therefore has the potential to incorporate the desirable attributes of each class of material into a single film.

The addition of fluorine to organosilicon films is anticipated to lower the dielectric constant, increase electrical resistivity, reduce surface energy, increase hydophobicity, and reduce permeability to water. All of these trends are favorable for biopassivation applications. The copolymer films can also retain the desirable adhesion characteristics and mechanical properties of the organosilicon homopolymer. Flexible copolymer films could also be used as biopassivation coatings on biomedical device components.

Transparent, tough, hard, scratch resistant films having extreme hydrophobicity would make excellent protective and dirt resistant coatings on window glass, windshields, and eyewear. Since the substrate remains at low temperature during the process, temperature sensitive materials such as plastics and fabrics can also be coated. Potential applications include anti-fouling coatings on marine vessels and equipment, coatings for food containers, and biological and chemical laboratory equipment. The hybrid copolymer can also serve as an intermediate transition layer for graded coatings such as the stack substrate-organosilicon-copolymer-fluoropolymer. Such an arrangement can produce an adherent interface with a hydrophobic surface, or even a film in which one surface is hydrophobic and the other hydrophilic.

Organosilicon or fluorocarbon homopolymers can be coated onto surfaces by a number of techniques such as spin-on coating, casting or chemical vapor deposition. An important advantage of chemical vapor deposition (CVD) is the ability to create copolymers that are difficult to synthesize by bulk or solution techniques, such as fluorocarbon-organosilicon copolymers. Fluorocarbon polymers are normally synthesized by free radical polymerization, whereas polysiloxanes are made by ionic polymerization techniques. Synthesis of a copolymer would thus require a transformation from ionic polymerization to free radical polymerization (or vice versa). Although several transformation techniques have been reported in the literature, to our knowledge, none of these methods have been applied to the synthesis of fluorocarbon-organosilicon copolymers. Serhatli, I. E., Galli, G., Yagci, Y., Chiellini, E. *Polym. Bull.* 1995, 34, 539; Cunliffe, A. V., Hayes, G. F., Richards, D. H. *J. Polym. Sci.* (B) 1976, 14, 483; Souel, T., Schue, F., Abadie, M., and Richards, D. H. *Polymer* 1977, 18, 1292.

Among the different CVD techniques available, hot-filament CVD (HFCVD, also known as pyrolytic or hot-wire CVD) is unique in several respects. In HFCVD, a precursor gas is thermally decomposed by a resistively heated filament. The resulting pyrolysis products adsorb onto a substrate maintained at around room temperature and react to form a film. HFCVD does not require the generation of a plasma, thereby avoiding defects in the growing film produced by UV irradiation and ion bombardment. In addition, films produced by HFCVD have a better-defined chemical structure because there are fewer reaction pathways than in the less selective plasma-enhanced CVD method. HFCVD provides films with a substantially lower density of dangling bonds, i.e. unpaired electrons. Further, HFCVD has been shown to produce films that have a low degree of crosslinking. Limb, S. J., Lau, K. K. S., Edell, D. J., Gleason, E. F., Gleason, K. K. *Plasmas and Polymers* 1999, 4, 21.

HFCVD has been used to deposit fluorocarbon films that are spectroscopically similar to poly(tetrafluoroethylene) (PTFE) as well as organosilicon films that consist of linear and cyclic siloxane repeat units. Limb, S. J., Lau, K. K. S., Edell, D. J., Gleason, E. F., Gleason, K. K. *Plasmas and Polymers* 1999, 4, 21. Few attempts have been made to create fluorocarbon-organosilicon copolymers by CVD, and these have been limited to plasma-enhanced CVD (PECVD). Sakata, J., Yamamoto, M., Tajima, I. *J. Polym. Sci.* (A) 1988, 26, 1721; Kim, D. S., Lee, Y. H., Park, N. *Appl. Phys. Lett* 1996, 69, 2776; Shirafuji, T., Miyazaki, Y., Nakagami, Y., Hayashi, Y., Nishino, S. *Jpn. J. Appl. Phys.* 1999, 38 Pt. 1 No. 7B, 4520; H. Kotoh, M. Muroyama, M. Sasaki, M. Iwasawa, *Jpn. J. Appl. Phys.* 1996, 35 Pt. 1, No. 2B, 1464; and P. Favia, G. Caporiccio, R. d'Agostino, *J. Polym. Sci. Part A: Polym. Chem.* 1994, 32, 121–130. Sakata et al. obtained thin films using hexamethyldisiloxane (HMDSO) and tetrafluoromethane ($CF_4$) by plasma-enhanced CVD. Sakata, J., Yamamoto, M., Tajima, I. *J. Polym. Sci.* (A) 1988, 26, 1721. The structure of the films was found to be different from a simple blend of fluorocarbon and organosilicon polymers. In other words, the polymer film did not consist of simple block or random copolymers. The authors observed the presence of Si—F bonds, and the data presented indicates that most of the fluorine in the films was bonded to silicon.

Similar results were obtained by Kim et al. with HMDSO and perfluorobenzene ($C_6F_6$). Kim, D. S., Lee, Y. H., Park, N. *Appl. Phys. Lett* 1996, 69, 2776. This investigation also included dielectric constant measurements and adhesion tests. The dielectric constants of the copolymer films were found to lie between those of the respective homopolymeric films, between 2 (pure fluorocarbon) and 4 (pure organosilicon). Annealing the films brought about a slight decrease in the dielectric constant. Adhesion of these films to silicon substrates was measured using the ASTM tape test and was determined to be better than that of pure fluorocarbon films.

Favia et al. investigated the plasma-enhanced CVD of a cyclic fluorinated siloxane, (3,3,3-trifluoropropyl) methylcyclotrisiloxane. P. Favia, G. Caporiccio, R. d'Agostino, *J. Polym. Sci. Part A: Polym. Chem.* 1994, 32, 121-130. The authors examined the effects of varying substrate temperature and substrate bias on the deposition rate and chemical composition of the films. Films deposited with substrate temperatures below 200° C. were determined to be structurally similar to the precursor. The carbon and hydrogen content of the films was found to decrease at higher substrate temperatures along with the deposition rate. Increasing the substrate bias resulted in greater crosslinking and higher deposition rate. The authors emphasize the absence of Si—F, Si—H and O—H bonds in their films.

There still exists a need for a reliable method of depositing fluorocarbon-organosilicon copolymer thin films with well-resolved bonding environments. We describe herein HFCVD methods for forming fluorocarbon-organosilicon films without the complex structures and undefined spectroscopic features associated with PECVD methods. Extensive spectroscopic characterization confirms the presence of covalent bonds between $CF_2$ groups and siloxane-based polymeric units in the film.

SUMMARY OF THE INVENTION

The invention overcomes limitations of prior deposition processes to enable production of copolymer thin films with well defined bonding environments, and addresses the many biomedical and microfabrication applications for such a film. Accordingly, in one aspect, the invention provides a method for forming a copolymer thin film on the surface of a structure. Preferably, the copolymer is a fluorocarbon-organosilicon copolymer. This is accomplished by exposing the monomer gasses of a fluorocarbon precursor and organosilicon precursor to a source of heat having a temperature sufficient to pyrolyze the monomer gasses and produce a source of reactive $CF_2$ and siloxane species in the vicinity of the structure surface. The structure surface is maintained at a substantially lower temperature than that of the heat source to induce deposition and polymerization of the $CF_2$ and siloxane species on the structure surface.

Preferably, the gas mixture comprises hexafluoropropylene oxide and hexamethylcyclotrisiloxane, and the heat source preferably is a resistively-heated conducting filament suspended over the structure surface or a heated plate having a pyrolysis surface that faces the structure. The heat source temperature is preferably greater than about 400K and the structure surface is preferably maintained at a temperature less than about 300K.

The structure on which surface the film is formed can be, for example only, a length of wire, a substrate, a neural probe, a razor blade, a ribbon cable, or a microstructure having multiple surfaces all maintained at a temperature substantially lower than that of the heat source.

In another aspect, the invention provides a method for coating a non planar and flexible structure with a flexible fluorocarbon-organosilicon copolymer film. The coating is accomplished by exposing the structure to an environment in which monomer gasses are pyrolyzed to produce reactive $CF_2$ and organosilicon species.

The invention also provides a method for substantially encapsulating a length of wire in a flexible fluorocarbon-organosilicon copolymer thin film. In the method, the wire length is supported on a wire holder such that surfaces of the wire length are substantially unmasked and portions of the wire length are out of contact with each other. The encapsulation process includes the step of exposing the monomer fluorocarbon and organosilicon gasses to a heat source to pyrolyze the monomer gasses and produce a source of reactive $CF_2$ and organosilicon species in the vicinity of the wire length, which is, e.g., between about 10 microns and 100 microns in diameter. The wire length is maintained at a temperature substantially lower than that of the heat source to induce deposition and polymerization of the $CF_2$ and organosilicon species on the wire length.

In another aspect of the invention, there is provided a method for casting a flexile structure in a desired configuration. This is accomplished by deforming the structure into the desired configuration and exposing the deformed structure to an environment in which monomer gasses of a fluorocarbon and organosilicon are pyrolyzed at high temperatures to form reactive monomeric species. Exposure of the deformed structure to the reactive monomeric species is maintained for a duration sufficient to produce on the deformed structure a fluorocarbon-organosilicon copolymer film having a thickness of more than about 5 microns.

The invention also provides a length of twisted wire that includes a plurality of entwined wires and a flexible fluorocarbon-organosilicon copolymer thin film encapsulating the entwined wire plurality along at least a portion of the twisted wire length. Also provided by the invention is a length of tubing that includes a thin-walled, flexible polymeric cylinder and flexible fluorocarbon-organosilicon copolymer thin film on an outer surface of the cylinder along at least a portion of the tubing length.

In another aspect, there is provided by the invention a neural probe. The neural probe includes a substantially cylindrical shaft portion having a diameter less than about 100 microns and a tip portion connected to the shaft portion by a tapered shaft portion. The tip has a diameter less than about 15 microns. A flexible fluorocarbon-organosilicon copolymer film encapsulates the tapered shaft portion and cylindrical shaft portion of the probe.

The invention additionally provides a substrate having a fluorocarbon-organosilicon copolymer thin film of less than 20 microns in thickness thereon; and further provides a microfabricated electronic circuit including at least one conducting layer having a fluorocarbon-organosilicon copolymer thin film of less than about 20 microns in thickness thereon.

In exemplary embodiments, the polymer thin film on the substrate or conducting layer has a dangling bond density of less than about $10^{18}$ spins/cm$^3$.

The invention is also drawn to a fluorocarbon-organosilicon copolymer coating prepared by HFCVD methods where monomeric fluorocarbon and organosilicon gasses are pyrolyzed to form reactive $CF_2$ and organosilicon species which copolymerize at ambient temperatures.

The invention is also drawn to an apparatus for carrying out HFCVD of two or more monomeric gasses to form a copolymer film on a structure surface.

The various methods of forming fluorocarbon-organosilicon copolymer thin films provided by the invention, and the resulting films, address a wide range of thin film applications, including biomedical and microfabrication applications, as well as numerous mechanical configurations in which a thin coating possessing the combined properties of fluorocarbon and organosilicon films is desired. Other features and advantages of the invention will be apparent from the claims, and from the following detailed description.

DETAILED DESCRIPTION OF THE INVENTION

Definitions

Figure 1:
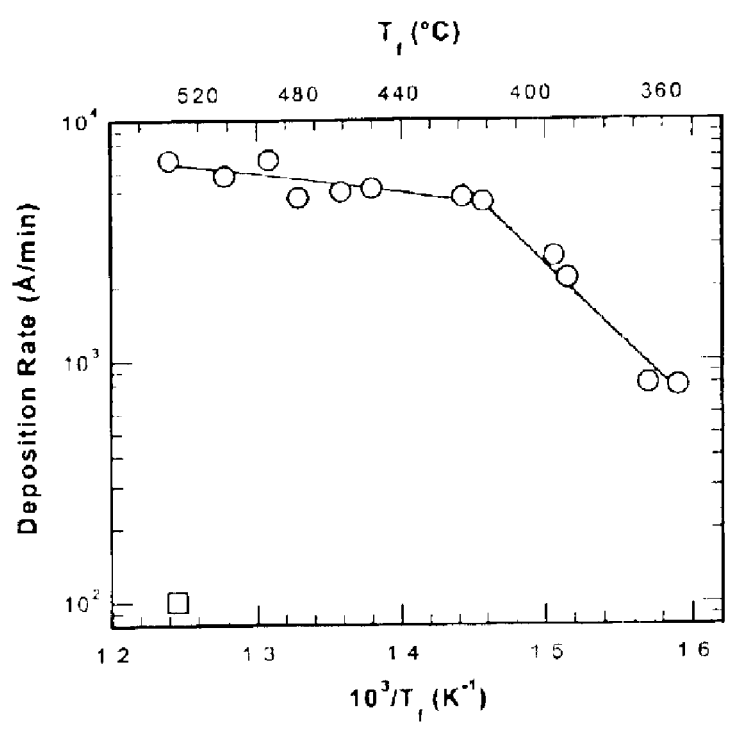
FIG. 1 depicts deposition rates of HFCVD films deposited from $V_3D_3$ and PFOSF as a function of filament temperature ($T_f$). Data points marked with circles are for films deposited from $V_3D_3$ and PFOSF. The data point marked with a square represents a film deposited from $V_3D_3$ alone.

For convenience, certain terms employed in the specification, examples, and appended claims are collected here.

The term "copolymer" as used herein means a polymer of two or more different monomers.

The term "fluorocarbon" as used herein means a halocarbon compound in which fluorine replaces some or all hydrogen atoms.

The term "organosilicon" as used herein means a compound containing at least one Si—C bond.

The term "chemical vapor deposition" as used herein means a process which transforms gaseous molecules or radicals into solid material in the form of thin film or powder on the surface of a substrate.

The term "carbene" as used herein means a reactive intermediate that has the general formula $R_2C$:, in which carbon has only a sextet of electrons.

The abbreviation "HFPO" as used herein means hexafluoropropylene oxide, an epoxide of the formula $CF_3CF(O)CF_2$ and presented below.

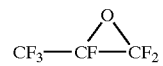

The term "D units" as used herein means a chemical unit of formula $—OSi(CH_3)_2—$.

The term "$D_3$" as used herein means hexamethylcyclotrisiloxane, a cyclic compound of the formula $(—OSi(CH_3)_2—)_3$ and presented below.

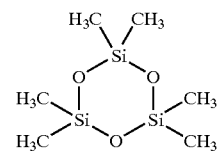

The term "$D_4$" as used herein means octamethylcyclotetrasiloxane, a cyclic compound of the formula $(—OSi(CH_3)_2—)_4$ and presented below.

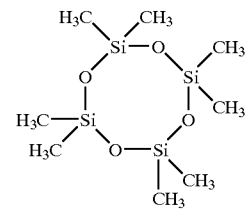

The term "$V_3D_3$" as used herein means 1,3,5-trivinyl-1,3,5-trimethylcyclotrisiloxane, a cyclic compound of the formula $(—OSi(CH_3)(CH=CH_2)—)_3$ and presented below.

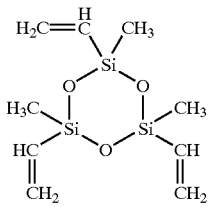

The term "PFOSF" as used herein means perfluorooctane sulfonyl fluoride.

The term "biopassivation" as used herein means the property of a structure surface that renders the structure impervious to its biological environment.

For purposes of this invention, the chemical elements are identified in accordance with the Periodic Table of the Elements, CAS version, Handbook of Chemistry and Physics, 67th Ed., 1986–87, inside cover.

Fluorocarbon and Organosilicon Film Structure

The repeat units in the copolymer film consist of fluorocarbon units, siloxane units, and linkages between them. Spectroscopic data indicates that the fluorocarbon content of the films is almost entirely in the form of $CF_2$ and that siloxane D units are present in both linear and cyclic form. There are four distinct types of copolymer linkages. The Si—$CF_2$Si linkage can be present between siloxane rings or between rings and linear siloxane groups. The $(CH_3)_2Si(CF_2)(O)$ link is linear, and could act as a junction between linear siloxane segments and fluorocarbon units. $(O)_2Si(CF_2)_2$ units are branch points, and can be present in siloxane rings or in linear chains. The $(O)_3Si(CF_2)$ unit, which is present in low concentration, is a crosslinking group.

All of the siloxane rings in the film have some degree of $CF_2$ substitution, and hence these can also be considered as crosslinking groups and branch points. Since there is no evidence of tertiary carbon, crosslinking and branching occur entirely via these siloxane moieties.

Chain termination takes place primarily with siloxane rings (Si—Si bonding between the repeat unit and the terminating ring). Termination could also occur by means of $CF_3CF_2Si$ or $CF_3CF_2CF_2$, but the concentration of these linkages is small.

Notably, and in contrast to films deposited by PECVD, films deposited via hot-filament CVD (HFCVD) have well-defined compositions. For example, PECVD-deposited fluorocarbon films comprise a variety of CF groups (e.g., $CF_3$, tertiary C, and C—F, in addition to $CF_2$), while HFCVD-deposited fluorocarbon films consist almost entirely of $CF_2$, along with a small amount of $CF_3$ moieties. Further, the initiating and terminating groups in HFCVD are well-defined; whereas the precursors in PECVD processes undergo much greater fragmentation (these films have Si—F bonds, for instance, that result from total fragmentation of the fluorocarbon precursors). A consequence of the nature of the HFCVD process is that only the most thermally stable groups (e.g., $CF_2$ and siloxane rings) appear in the film, resulting in more thermally stable films.

One of the most important specific chemical differences between hot-filament CVD and plasma-enhanced CVD is the occurrence of ion-bombardment and ultraviolet-irradiation in the latter technique. Due to this difference, HFCVD films do not contain defects seen in PECVD films. For example, HFCVD films do not have dangling bonds, which are always produced in PECVD processes. Dangling bonds are unpaired electrons left behind in the film. If such bonds are present, the film will undergo reactions with components of the ambient atmosphere (such as water, for instance, resulting in a large number of hydroxyl groups). Therefore, PECVD films are more susceptible to atmospheric ageing, and degradation of their optical, electrical and chemical properties. Moreover, films produced by HFCVD processes are less dense than those produced by plasma-enhanced CVD processes. Due to the differences between the nucleation and growth mechanisms the two processes, it is possible to make porous films using HFCVD, but not using PECVD. Porosity is an important property for semiconductor applications because it allows further lowering of the dielectric constant of existing low-κ materials by virtue of the low dielectric constant of air.

Initiation of Cyclic Vinylmethylsiloxane Polymerization

The role of an initiator (perfluorooctane sulfonyl fluoride, PFOSF) in the polymerization of 1,3,5-trivinyl-1,3,5-trimethylcyclotrisiloxane ($V_3D_3$) by hot-filament chemical vapor deposition (HFCVD) has been demonstrated. Use of the initiator allows rapid deposition of films at significantly lower filament temperatures. Polymerization is initiated when radical species produced by the pyrolysis of PFOSF react with $V_3D_3$. Chain propagation occurs along the vinyl bonds of $V_3D_3$, resulting in chains with hydrocarbon backbones and siloxane rings as pendant groups. Chains are terminated by fluorocarbon radicals, sulfonyl fluoride radicals or other propagating chains.

The use of an initiator in HFCVD allows films to be deposited at significantly higher rates and provides greater control over chemical composition and morphology. This was demonstrated by Pryce Lewis et al. for fluorocarbon films deposited from hexafluoropropylene oxide (HFPO) using perfluorooctane sulfonyl fluoride (PFOSF) as an initiator. Pryce Lewis, H. G.; Caulfield, J. A.; Gleason, K. K. *Langmuir* 2001, 17, 7652. In the mechanism proposed for film growth, the generation of free radicals from the pyrolysis of PFOSF is the initiation step:

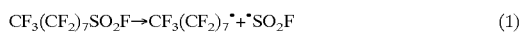

$$CF_3(CF_2)_7SO_2F \rightarrow CF_3(CF_2)_7{}^\bullet + {}^\bullet SO_2F \quad (1)$$

The fluorocarbon radical subsequently combines with the propagating species, difluorocarbene ($CF_2$), which is generated by the pyrolysis of HFPO. The use of PFOSF resulted in higher deposition rates, more efficient utilization of HFPO, and endcapping by $CF_3$ groups.

PFOSF can be used as an initiator in the HFCVD of polymeric films from a cyclic vinylmethylsiloxane, 1,3,5-trivinyl-1,3,5-trimethylcyclotrisiloxane ($V_3D_3$). As in the case of fluorocarbon films, use of PFOSF allows rapid deposition of films at relatively low filament temperatures. Spectroscopic characterization shows that chain propagation occurs by polymerization across the vinyl bonds of $V_3D_3$. This HFCVD process thus resembles classical free radical polymerization of vinyl monomers driven by an initiator. Odian, G. *Principles of Polymerization*, Wiley-Interscience: New York, 1991. The synthetic approach described in this work can be applied to other vinyl monomers. In addition, the combination of PFOSF with $V_3D_3$ results in a fluorocarbon-organosilicon copolymer with unique chemical properties compared to those produced in past HFCVD work or by conventional synthesis. Murthy, S. K.; Gleason, K. K. *Macromolecules* 2002, 35, 1967; Doeff, M. M.; Lindner, E. *Macromolecules* 1989, 22, 2951; Chen, G. J.; Tamborski, C. *J. Organomet. Chem.* 1985, 293, 313; Owen, M. J. In *Block Copolymers Science and Technology*; Meier, D. J., Ed.; MMI Press: Midland, 1983; Vol. 3, p 129; and Owen, M. J.; Kobayashi, H. *Macromol Symp.* 1994, 82, 115.

Deposition Rate

The synthesis of organosilicon films from $V_3D_3$ by HFCVD using a Nichrome filament with no initiator requires filament temperatures greater than 530° C. Under these conditions, the deposition rate is relatively low (around 100 Å/min), and deteriorates as filament age increases. Introducing PFOSF into the reaction chamber results in much higher film growth rates and allows deposition at lower filament temperatures, as indicated in FIG. 1. Further, there is significantly less change in deposition rate over time during individual experiments.

Plots such as FIG. 1 have been used in the vapor deposition literature to obtain activation energies by using Arrhenius equations to fit the data. Pryce Lewis, H. G.; Caulfield, J. A.; Gleason, K. K. *Langmuir* 2001, 17, 7652; Kubono, A.; Okui, N. *Prog. Polym. Sci.* 1994, 19, 389; and Pierson, H. O. *Handbook of Chemical Vapor Deposition*, 2nd ed.; Noyes Publications: Norwich, N.Y., 1999. However, such a calculation is not justified in this instance because the deposition rate is not zero order in PFOSF in the range of filament temperatures being considered. Changing the PFOSF/$V_3D_3$ flow ratio does result in changes in deposition rate, indicating that the deposition rate is dependent on the concentration of PFOSF. Nevertheless, FIG. 1 shows that there are two distinct regimes of film growth. In the region between 350° C. and 420° C., the deposition rate is strongly influenced by filament temperature. Since films from $V_3D_3$ alone cannot be deposited in this filament temperature range, this suggests that film growth is initiator-limited between 350° C. and 420° C. Above 420 ° C., the increase in deposition rate is less rapid, and it is postulated that film growth is limited by mass-transfer effects. For fluorocarbon films deposited from HFPO and PFOSF, similar behavior was observed, with the transition point at 460° C. The difference in transition temperatures is most likely due to differences in reaction kinetics.

No enhancement in deposition rate was observed when similar experiments were performed using hexamethylcyclotrisiloxane ($D_3$) and PFOSF as precursors. Since the only difference between the two siloxane precursors, $D_3$ and $V_3D_3$, is the presence of vinyl groups in the latter, these results indicate that vinyl groups play a critical role in initiation and subsequent film growth.

Film Structure

The polymerization of $V_3D_3$ in this HFCVD process is initiated by reactions between fluorocarbon radicals and vinyl groups in the $V_3D_3$ molecules. Radical species generated by these reactions can react with other $V_3D_3$ molecules to propagate chains along vinyl bonds. These chains consist of hydrocarbon backbones with siloxane rings as pendant groups. Cross-linking between chains occurs if more than one vinyl group on any $V_3D_3$ molecule undergoes initiation and propagation reactions. Chain termination occurs when these propagating chains react with fluorocarbon radicals, sulfonyl fluoride radicals or with other propagating chains. As the filament temperature is increased, vinyl abstraction from the silicon atoms becomes more prevalent, as does breakdown of the siloxane rings to vinylmethylsilanone. As a result, the concentration of siloxane rings decreases and the films consist of polymer chains with siloxane backbones. Furthermore, these siloxane chains have a high degree of crosslinking via T groups.

Thermal Analysis

Figure 2:
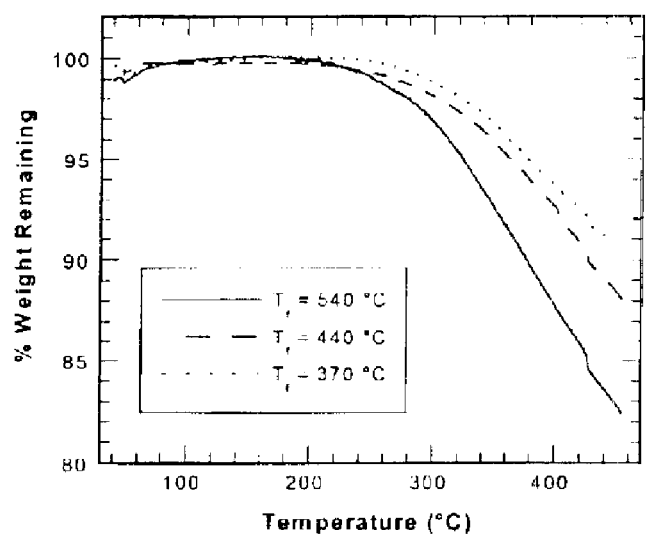
FIG. 2 depicts TGA analysis of the HFCVD films deposited from $V_3D_3$ and PFOSF at three different filament temperatures.

FIG. 2 shows the TGA results for films deposited at 370° C., 440° C., and 540° C. The six-membered cyclic siloxane, hexamethylcyclotrisiloxane, is known to be more thermally stable than linear poly(dimethylsiloxane) (PDMS). M. J. Michalczyk, W. E. Fameth, A. J. Vega *Chem. Mater.* 5, 1687 (1993). It is also known that cross-linking siloxane rings into network structures improves thermal stability. M. J. Michalczyk, W. E. Fameth, A. J. Vega *Chem. Mater.* 5, 1687 (1993). In this arrangement, the siloxane rings are the repeat units, and the structure takes advantage of the superior thermal stability of the siloxane rings relative to linear PDMS. The HFCVD film deposited using a filament temperature of 370° C. is similar to this type of architecture since the structure consists of carbon backbone chains with siloxane ring pendant groups. Individual siloxane rings can be connected to more than one carbon chain since more than one vinyl group on a ring can undergo polymerization. The HFCVD film deposited at 540° C., on the other hand, is almost completely devoid of ring structures, and would therefore have lower thermal stability relative to the 370° C. film.

As expected, the onset of thermal decomposition of the 370° C. film occurs at a higher temperature compared to the 540° C. film (FIG. 2). The film deposited at 440° C. lies in-between, consistent with a mixture of rings and linear units in the film structure.

The chemical structure of fluorocarbon-organosilicon films synthesized from $V_3D_3$ and PFOSF by HFCVD is dependent on filament temperature. At low filament temperature, the films are comprised of carbon-backbone polymer chains with siloxane rings as pendant groups, whereas at higher filament temperatures the films consist of linear siloxane chains crosslinked via T groups. The retention of the siloxane ring structure confers greater thermal stability on the low filament temperature films. The high concentration of T groups in the high filament temperature films is manifest in the form of brittleness observed in wire coatings. Overall, the 370° C. film appears to be the best candidate for biomedical applications based on its flexibility and thermal stability.

Wire Coatings

Figure 3:
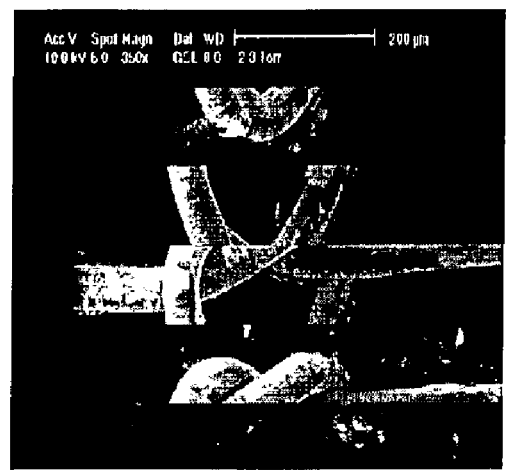
FIG. 3 depicts environmental scanning electron micrographs of HFCVD wire coatings on 50 μm diameter platinum wires deposited from $V_3D_3$ and PFOSF at filament temperatures of (a) 540° C., (b) 440° C., and (c) 370° C.
Figure 3:
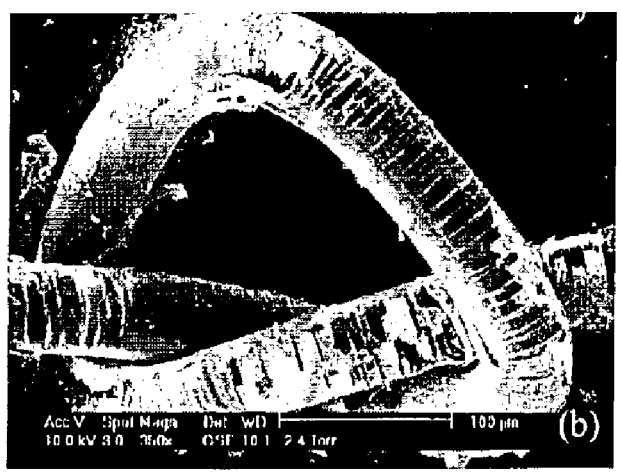
Figure 3:
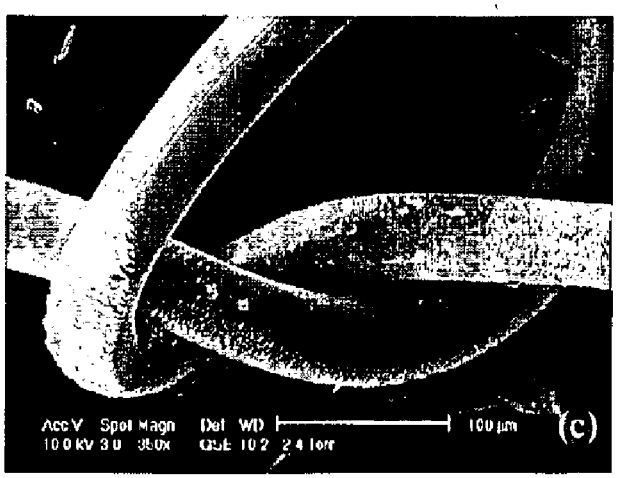

FIG. 3 shows micrographs of wire coatings made from $V_3D_3$ and PFOSF at the same set of filament temperatures. The wires were tied into loops to examine the flexibility of the copolymer coating. The difference in chemical composition manifests itself in the form of brittleness, which increases as filament temperature is increased. The film deposited with a filament temperature of 540° C. cracks extensively when the wire is bent and peels off almost completely. The 440° C. coating is marginally better, and the 370° C. coating shows no apparent cracking. This trend is consistent with the brittleness observed with increasing T group concentration in organosilicon films deposited by plasma CVD by Cech et al. and also with the higher rigidity of ladder-like siloxane polymers (comprised almost entirely of T groups) relative to linear polysiloxanes. V. Cech, P. Horvath, M. Trchova, J. Zemek, J. Matejkova *J. Appl. Polym. Sci.* 82, 2106 (2001); and T. V. Timofeeva, I. L. Dubchak, V. G. Dashevsky, Y. T. Struchkov *Polyhedron* 3, 1109 (1984).

This test demonstrates a qualitative similarity between these coatings and fluorocarbon coatings deposited from hexafluoropropylene oxide by Limb et al. S. J. Limb, K. K. Gleason, D. J. Edell, E. F. Gleason *J. Vac. Sci. Technol.* A 15, 1814 (1997). Fluorocarbon coatings with a high degree of crosslinking were found to be more brittle than those comprised of mostly linear chains.

Spectroscopic Results

The instrumentation and methods for measuring the spectroscopic data discussed below are disclosed under the Exemplification section.

Fourier Transform Infrared (FTIR) Spectroscopy

Figure 4:
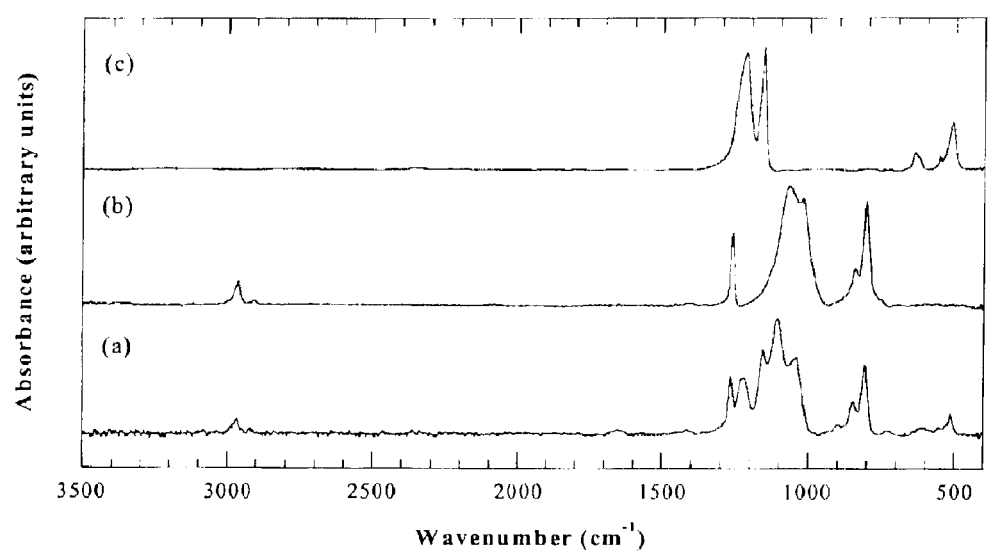
FIG. 4 depicts FTIR spectra of (a) copolymer film, (b) silicone film and (c) fluorocarbon film, all deposited by HFCVD under the same conditions. The fluorocarbon precursor is HFPO and the silicone precursor is $D_3$.

FIG. 4 shows the FTIR spectrum of a copolymer film compared with the spectra of homopolymeric fluorocarbon and silicone films obtained from HFPO and $D_3$ respectively. Table 1 gives the absorption band assignments from the literature. All of the bands associated with the pure fluorocarbon and the pure silicone film appear in the hybrid film, although slight shifts in position occur in some of the bands. Limb, S. J., Lau, K. K. S., Edell, D. J., Gleason, E. F., Gleason, K. K. *Plasmas and Polymers* 1999, 4, 21.

TABLE 1

Absorption Band Assignments for FTIR Spectra

| ASSIGNMENT | Copolymer [cm$^{-1}$] | Literature [cm$^{-1}$] | Reference |
|---|---|---|---|
| $CF_2$ rocking | 514 | 516–520 | a, b |
| $CF_2$ wagging | 610 | 650 | c |
| Si—C stretching, $CH_3$ rocking in Si—$Me_2$ | 808 | 805 | d |
| Si—C stretching, $CH_3$ rocking in Si—$Me_3$ | 848 | 845 | d |
| Si—C stretching, $CH_3$ rocking in Si$(Me)_2(CF_2)$ | 899 | N/A | N/A |
| Si—O—Si asymmetric stretching | 1043; 1107 | 1050 | d |
| $CF_2$ symmetric stretching | 1155 | 1160 | c |
| $CF_2$ asymmetric stretching | 1223 | 1220 | c |
| $CH_3$ symmetric bending in Si—$Me_x$ | 1265 | 1260 | d |
| CH symmetric stretching in sp$^3$ $CH_3$ | 2913 | 2900 | d |
| CH asymmetric stretching in sp$^3$ $CH_3$ | 2967 | 2960 | d | a. Moynihan, R. E. J. Am. Chem. Soc. 1959, 81, 1045;
b. Liang, C. Y.; Krimm, S. J. Chem. Phys. 1956, 25, 563;
c. d'Agostino, R.; Cramarossa, F.; Fracassi, F.; Illuzzi, F. In Plasma Deposition, Treatment, and Etching of Polymers; d'Agostino, R., Ed.; Academic Press: San Diego, 1990; p 95–162;
d. Rau, C.; Kulisch, W. Thin Solid Films 1994, 249, 28.

The FTIR bands in all three HFCVD films in FIG. 4 are relatively narrow (FWHM of ~60 cm$^{-1}$ or less), aiding in the resolution of specific chemical environments. For example, the symmetric (1155 cm$^{-1}$) and asymmetric (1223 cm$^{-1}$) $CF_2$ stretches can be clearly resolved in FIG. 4(c). In plasma deposited films, there is typically only one broad band in the 1100–1500 cm$^{-1}$ region resulting from overlap of several types of C—F bonding environments. Limb, S. J.; Lau, K. K. S.; Edell, D. J.; Gleason, E. F.; Gleason, K. K. *Plasmas and Polymers* 1999, 4, 21. The narrowness of the FTIR bands thus indicates the structural simplicity of the HFCVD copolymer films.

Figure 5:
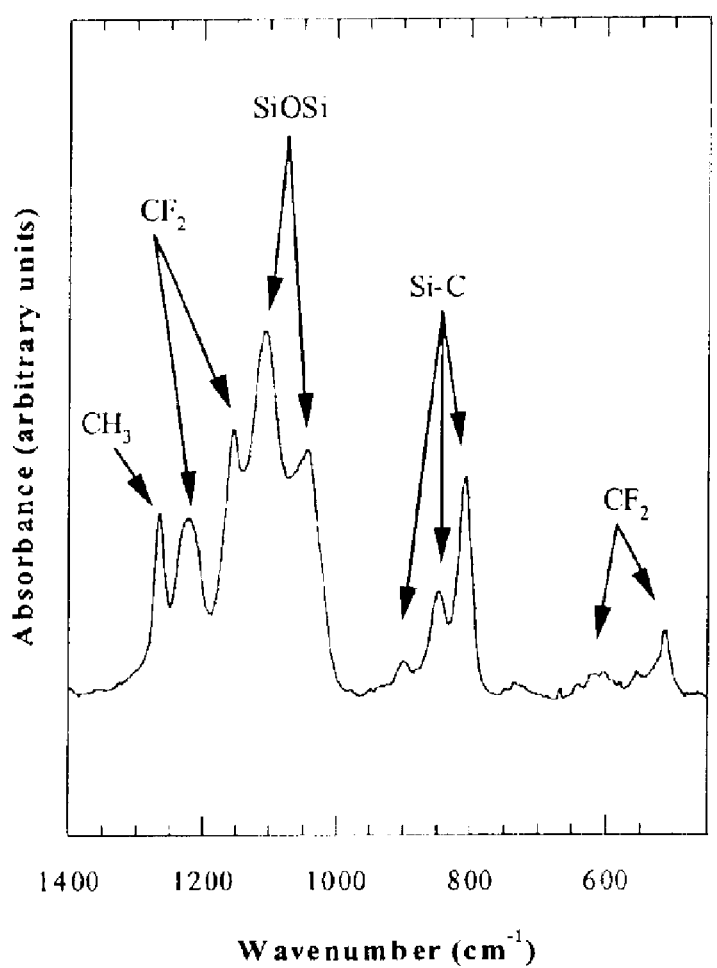
FIG. 5 depicts the low wavenumber region from an FTIR spectrum of the fluorocarbon-organosilicon copolymer deposited from $D_3$ and HFPO.

The asymmetric stretching mode (ASM) of the siloxane (Si—O—Si) group is also easily resolvable. The region around these bands in the copolymer spectrum is expanded for detail in FIG. 5. The ASM appears as a doublet, as in the case of polydimethylsiloxane chains with three or more siloxane units, or ring structures of more than eight siloxane units. Richards, R. E.; Thompson, H. W. *J. Chem. Soc.* 1949, 124; and Wright, N.; Hunter, M. J. *J. Am. Chem. Soc.* 1947, 69, 803. Both peaks of this doublet in the copolymer film (1043 and 1107 cm$^{-1}$) are shifted towards higher wavenumbers relative to the pure silicone film (1020 and 1068 cm$^{-1}$). No shift would be expected if the fluorocarbon and organosilicon moieties were simply depositing together as two independent phases. Also, it is known that electronegative substituents on the silicon atom increase the Si—O stretching frequency. Lin-Vien, D.; Colthup, N.; Fatteley, W. G.; Grasselli, J. G. *The Handbook of Infrared and Raman Characteristic Frequencies of Organic Molecules*; Academic Press: San Diego, 1991; p 258. Hence, the shift of the ASM is consistent with copolymerization, where bonds are formed between silicon atoms and $CF_2$ groups.

Two other modes (rocking and wagging) of the $CF_2$ groups appear at 514 and 610 cm$^{-1}$ in the copolymer spectrum. The band at 610 cm$^{-1}$ is shifted relative to its position in the pure fluorocarbon spectrum (620 cm$^{-1}$). This shift towards lower wavenumbers is consistent with the shift of the ASM in the opposite direction, an effect of the redistribution of electron density caused by copolymerization.

In the pure silicone film, Si—C stretching bands appear at 808 and 848 cm$^{-1}$. The copolymer spectrum contains both of these bands and a third band at 899 cm$^{-1}$. The Si—C stretching mode is dependent on the vibrations of the substituents on the silicon atom. Matsurra, H., Ohno, K., Sato, T., Murata, H. *J. Mol. Struct.* 1979, 52, 13. Hence it is likely that the band at 899 cm$^{-1}$ is due to the Si—C stretching mode of a siloxane moiety that has both methyl and $CF_2$ substituents bonded to silicon.

The bands at 2913 and 2967 cm$^{-1}$ represent the symmetric and asymmetric stretching modes of the CH bond in sp$^3$ $CH_3$ respectively. The absence of sp$^3$ $CH_2$ bands indicates that there is no crosslinking through methylene bridges.

Figure 6:
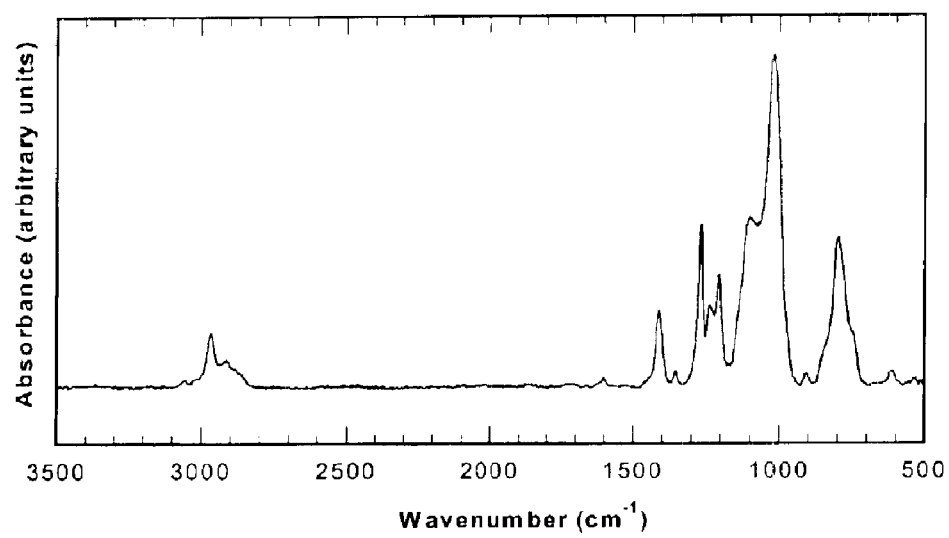
FIG. 6 depicts FTIR spectrum of the HFCVD film deposited from $V_3D_3$ and PFOSF at a filament temperature of 370° C.

FIG. 6 shows the FTIR spectrum of the film deposited from $V_3D_3$ and PFOSF at a filament temperature of 370° C. The asymmetric stretching mode (ASM) of the siloxane (Si—O—Si) group appears as a doublet with the low wavenumber band more intense than the high wavenumber band. In their investigation of organosilicon films deposited from $D_3$ by HFCVD, Pryce Lewis et al observed a similar trend in the ASM when the films had a greater proportion of siloxane rings relative to linear chains comprised of dimethylsiloxane groups. Pryce Lewis, H. G.; Casserly, T. B.; Gleason, K. K. *J. Electrochem. Soc.* 2001, 148(12), F212. The trend in the ASM therefore indicates that the siloxane ring structure of $V_3D_3$ molecules is substantially preserved.

Bands associated with vinyl groups appear at 3060, 3020, 1599 and 614 cm$^{-1}$. The intensity of these bands is small in the FTIR spectrum. In fluorocarbon films deposited by HFCVD, two stretching modes of $CF_2$ groups are observed at around 1160 cm$^{-1}$ and 1220 cm$^{-1}$. d'Agostino, R.; Cramarossa, F.; Fracassi, F.; Illuzzi, F. In *Plasma Deposition, Treatment, and Etching of Polymers*; d'Agostino, R., Ed.; Academic Press: New York, 1990, p 95. These peaks appear to be shifted towards lower wavenumbers in the spectra shown in FIG. 6, with the former band being masked by the left-hand peak of the ASM. This shift could be caused by bonding with $CH_2$ groups. The conversion of vinyl groups and the shift in peak position are both consistent with Reactions 2–4.

The peak at 1409 cm$^{-1}$ is in the region of the =$CH_2$ scissor mode, but its intensity and width suggest that it may be comprised of more than one band. This is also the region where the symmetric $SO_2$ stretching mode in $CH_3$—$SO_2$—F appears. Lin-Vien, D.; Colthup, N.; Fatteley, W. G.; Grasselli, J. G. *The Handbook of Infrared and Raman Characteristic Frequencies of Organic Molecules*, Academic Press: New York, 1991. It is therefore postulated that the second band in this region may be due to this mode in a related moiety, the CH(Si)$SO_2$F group.

X-ray Photoelectron Spectroscopy

Table 2 summarizes atomic composition data obtained from a survey scan. The Si:O ratio is approximately 1:1.13.

TABLE 2

XPS Survey Scan Data

| Binding Energy [eV] | ELEMENT | Atomic Concentration [%] |
|---|---|---|
| 101 | Si (2p) | 13.55 |
| 283 | C (1s) | 30.70 |
| 531 | O (1s) | 15.33 |
| 576 | Cr (2p) | 0.48 |
| 687 | F (1s) | 38.42 |
| 859 | Ni (2p) | 1.53 |

The high-resolution Si (2p) scan (not shown) contains a single peak with no apparent shoulders. The line width of this peak is slightly larger than that obtained from a film deposited under the same conditions using $D_3$ only. Hence, while the Si:O ratio suggests that the silicon atoms in the copolymer film are almost entirely in the +2 oxidation state, the line width of the Si (2p) peak indicates the possibility of a small concentration of different oxidation states.

A C 1s high-resolution scan (FIG. 7) indicates the presence of only two types of carbon moieties, $CF_2$ and $CH_3$. The respective assignments at 290.0 eV and 282.8 eV were made using data obtained from a pure fluorocarbon and a pure silicone film. The assumption that most of carbon present is either in the form of $CF_2$ or $CH_3$ will greatly simplify the process of making peak assignments in the NMR spectra.

The XPS survey scan also detected small amounts of nickel and chromium in the film (>1.5 atomic %). Since the same pyrolytic deposition could not be performed using a tantalum filament of equivalent diameter, this observation suggests that nichrome plays a catalytic role in the process.

Solid-State Nuclear Magnetic Resonance Spectroscopy

Figure 8:
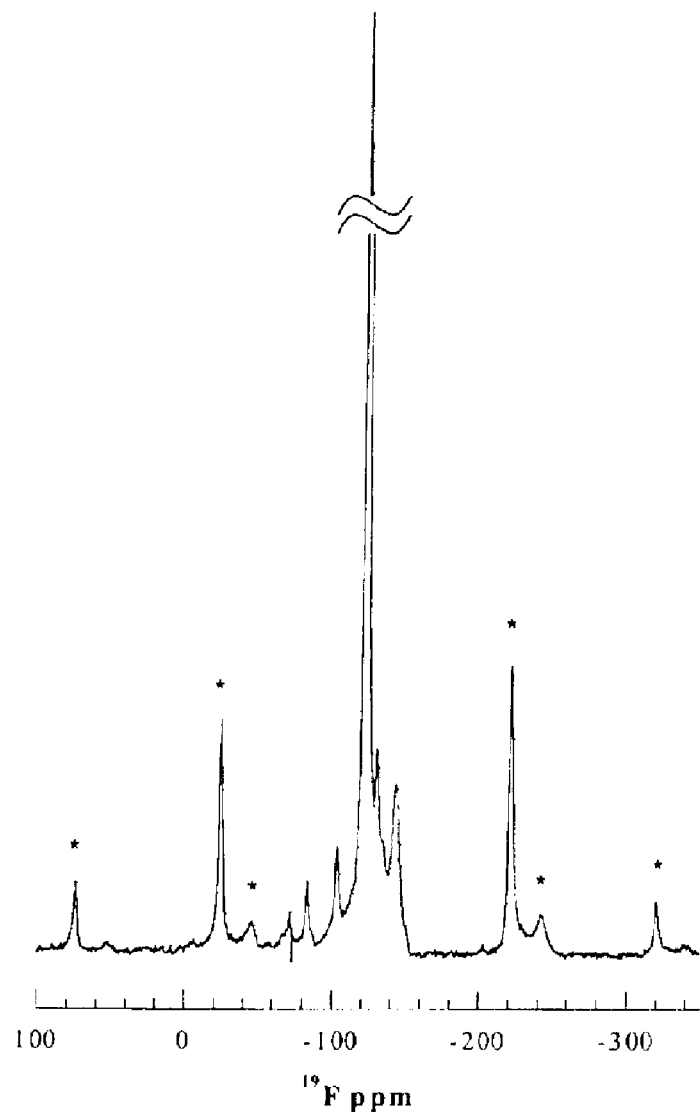
FIG. 8 depicts solid-state $^{19}F$ NMR spectrum of the HFCVD copolymer film deposited from $D_3$ and HFPO. The feature at −72 ppm is a spectrometer artifact.

The $^{19}F$ NMR spectrum of the copolymer film is shown in FIG. 8, with spinning side bands labeled by asterisks. The remaining seven peaks represent resolved isotropic chemical shifts for fluorine. Chemical shift assignments are listed in Table 3.

TABLE 3

Chemical shift assignments for the $^{19}F$ NMR spectrum

| Chemical Shift [ppm] | STRUCTURE | % Area | Reference |
|---|---|---|---|
| −83.6 | $CF_3{}^*CF_2$ | 1.65 | f, g, h, i, j, k, l |
| −104.5 | $CF_2{}^*O$ | 2.97 | m |
| −123.4 | $CF_2CF_2{}^*CF_2$ | 70.30 | f, g, h, i, j, k, l |
| −128.0 | $CF_3CF_2{}^*CF_2$ | 0.08 | f, g, h, i, j, k, l |
| −131.1 | $CF_2CF_2{}^*Si$ | 6.27 | e |
| −135.3 | $CF_3CF_2{}^*Si$ | 1.10 | e |
| −144.4 | $SiCF_2{}^*Si$ | 17.63 | e | e. Sharp, K. G.; Li, S., Johannesen, R. B. Inorg. Chem. 1976, 15, 2295;
f. Emsley, J. W., Phillips, L. Prog. NMR Spectrosc. 1971, 7, 1;
g. Dec, S. F., Wind, R. A., Maciel, G. E. Macromolecules 1987, 20, 2754;
h. English, A. D.' Garza, O. T. Macromolecules 1979, 12, 351;
i. Harris, R. K., Jackson, P. Chem. Rev. 1991, 91, 1427;
j. Kitoh, H., Muroyama, M., Sasaki, M., Iwasawa, M. Jpn. J. Appl. Phys. 1996, 35 Pt. 1, No. 2B, 1464;
k. Tonelli, C., Tortelli, V. J. Fluorine Chem. 1994, 67, 125;
l. Tortelli, V.; Tonelli, C.; Corvaja, C. J. Fluorine Chem. 1993, 60, 165;
m. Banks, R. E., Fluorocarbons and their Derivatives, 2nd ed.; MacDonald Technical and Scientific: London, 1970; p. 237.

$^{19}F$ NMR spectra of homopolymeric fluorocarbon films deposited by the same technique show three peaks: $CF_2CF_2{}^*CF_2$ at −123 ppm, $CF_3CF_2{}^*CF_2$ at −128 ppm, and $CF_3{}^*CF_2$ around −84 ppm. Limb, S. J.; Lau, K. K. S.; Edell, D. J.; Gleason, E. F.; Gleason, K. K. *Plasmas and Polymers* 1999, 4, 21. All three of these peaks are present in FIG. 8.

The assignments for the peaks at −131.1, −135.3 and −144.4 ppm are based on chemical shifts reported for various Si—$CF_2$ environments in perfluoro(alkylsilanes) by Sharp et al. Sharp, K. G.; Li, S.; Johannesen, R. B. *Inorg. Chem.* 1976, 15, 2295. It is postulated that these peaks correspond to $CF_2CF_2{}^*Si$, $CF_3CF_2Si$, and $SiCF_2{}^*Si$ respectively. The side bands that appear at −46 and −243 ppm are associated with the $SiCF_2{}^*Si$ peak, indicating a broad chemical shift tensor and a lack of mobility of the fluorine atoms in this environment. The $^{19}F$ spectrum also indicates the presence of a small number of $CF_2O$ linkages (−104.5 ppm). These could form as a result of copolymerization of $CF_2$ units and linear siloxane chains.

The presence of Si—$CF_3$ linkages was ruled out on the basis of $^{19}F$ and $^{29}Si$ NMR performed on a model compound $[CF_3—Si—(CH_3)_3]$. The observed $^{19}F$ and $^{29}Si$ shifts for this compound were −27.8 ppm and −36.2 ppm respectively.

Figure 9:
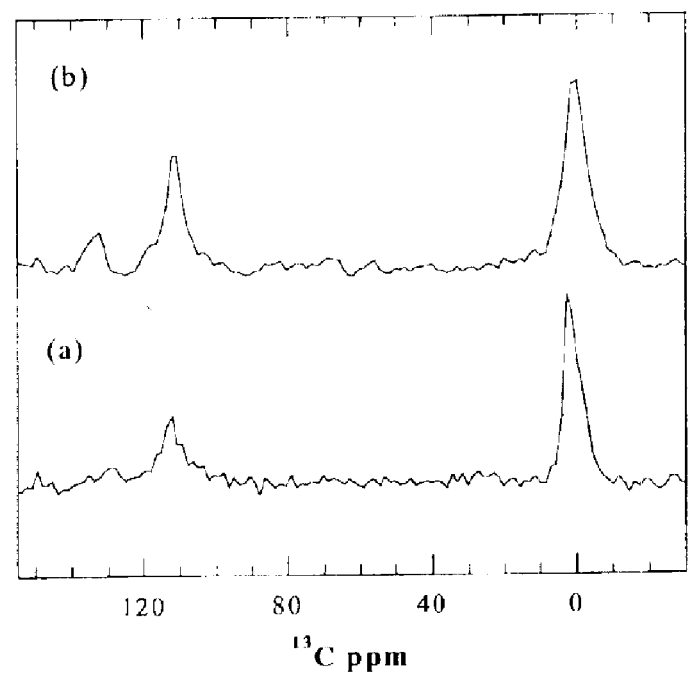
FIG. 9 depicts solid-state $^{13}C$ NMR spectra of the HFCVD copolymer film deposited from $D_3$ and HFPO, obtained with (a) $^1H$ and (b) $^{19}F$ decoupling.

FIG. 9 shows the $^{13}C$ NMR spectra obtained with $^1H$ and $^{19}F$ decoupling. Chemical shift assignments for these spectra are summarized in Table 4. Assignments for peaks (i)–(iii) are taken from the literature. Ovenall, D. W., Chang, J. J. *J. Magn. Reson.* 1977, 25, 361; Kaplan, S., Dilks, A. *J. Appl. Polym. Sci.: Appl. Polym. Symp.* 1984, 38, 105; Mallouk, T., Hawkins, B. L., Conrad, M. P., Zilm, K., Maciel, G. E., Bartlett, N. *Phil Trans. R. Soc. Lond. A* 1985, 314, 179; Schwerk, U., Engelke, F., Kleber, R., Michel, D. *Thin Solid Films* 1993, 230, 102; and Hagaman, E. W., Murray, D. K., Cul, G. D. D. *Energy Fuels* 1998, 12, 399.

TABLE 4

Chemical shift assignments for the $^{13}C$ NMR spectrum

| Peak | Chemical Shift [ppm] | STRUCTURE | % Area |
|---|---|---|---|
| (i) | 0 | $CH_3$ | 62.0 |
| (ii) | 112 | $CF_2$ | 29.4 |
| (iii) | 119 | $CF_3$ | 1.1 |
| (iv) | 131 | Si—$CF_2$—Si | 7.5 |

Figure 7:
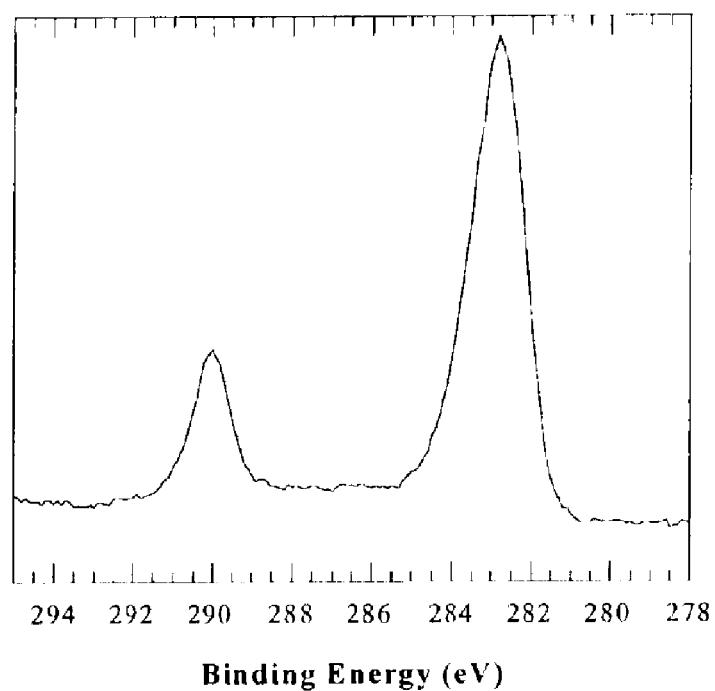
FIG. 7 depicts a carbon (1s) high-resolution x-ray photoelectron spectroscopic scan of the HFCVD copolymer film deposited from $D_3$ and HFPO, showing $CF_2$ and $CH_3$ peaks.

In these spectra, the $CH_3$ and $CF_2$ peaks are the most intense; hence the NMR analysis of the bulk film is in qualitative agreement with the surface analysis by C (1s) high-resolution XPS (FIG. 7). As expected, the $CH_3$ peak is narrowest in the proton-decoupled spectrum, while the $CF_2$ and $CF_3$ peaks are narrowest in the fluorine-decoupled spectrum. There is a small amount of $CF_3$, evidenced by the presence of a shoulder on the peak at 118.6 ppm.

Given the appreciable content of $SiCF_2{}^*Si$ in the $^{19}F$ spectrum, it seems likely that this moiety would also appear in the $^{13}C$ spectra. The peak at 131 ppm narrows considerably under fluorine decoupling and is therefore postulated to represent the $SiCF_2Si$ moiety. This hypothesis was tested by performing the following calculation.

In the $^{19}F$ spectrum, the contribution of fluorine atoms in $SiCF_2Si$ (peak area/2) was divided by the sum of contributions from all of the fluorine atoms [(sum of all $CF_2$ peak areas)/2+$CF_3$ peak area/3]. From the $^{13}C$ spectrum, the peak area of $SiCF_2Si$ was divided by the total area occupied by fluorocarbon groups [peaks (ii) through (iv)]. The resulting values are in agreement (within 10%), supporting the respective assignments in the $^{19}F$ and $^{13}C$ spectra. These assignments are further substantiated by the $^{19}F$ and $^{13}C$ NMR data reported for a related molecule ($FMe_2Si—CF_2—SiMe_2F$)

by Fritz and Bauer. Fritz, G., Bauer, H. *Angew. Chem. Int. Ed. Engl.* 1983, 22, 730. The identification of the SiCF$_2$Si linkage shows conclusively that the film is indeed a copolymer.

Figure 10:
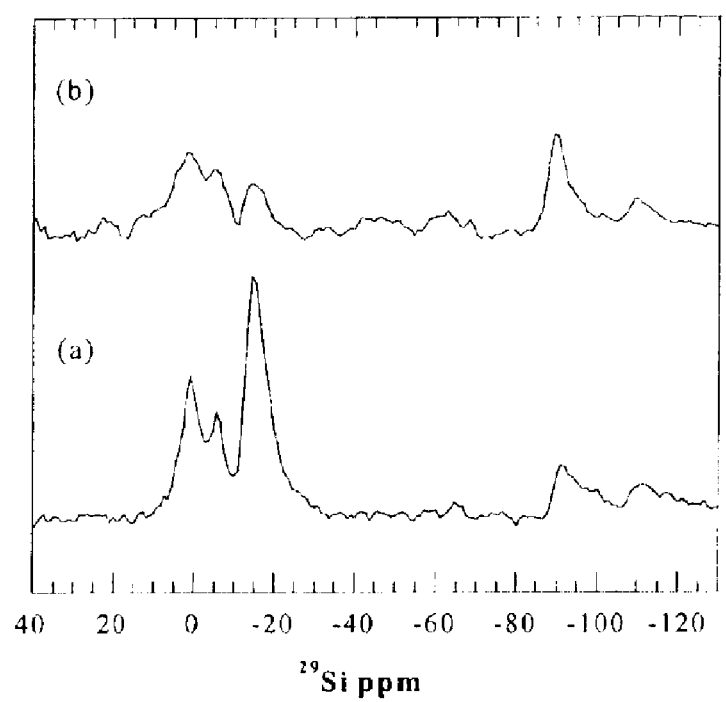
FIG. 10 depicts solid-state $^{29}Si$ NMR spectra of the HFCVD copolymer film deposited from $D_3$ and HFPO, obtained with (a) $^1H$ and (b) $^{19}F$ cross-polarization and decoupling.

$^{29}$Si NMR spectra obtained with $^1$H and $^{19}$F cross-polarization and dipolar decoupling (CP/DD) are shown in FIG. 10, with peak assignments listed in Table 5.

TABLE 5

Chemical shift assignments for the $^{29}$Si NMR spectrum

| Chemical Shift [ppm] | STRUCTURE |
|---|---|
| 0 | (CH$_3$)$_2$Si(O)(CF$_2$) |
| −6.4 | o-R$_3$ |
| −15.5 | (O)$_2$Si*(CH$_3$)$_2$ |
| −92.0 | (O)$_2$Si*(CF$_2$)$_2$ |
| −112.0 | (O)$_3$Si(CF$_2$) |

While the CP/DD method increases sensitivity, the peak areas do not yield quantitative concentrations. This is in contrast to the $^{19}$F and $^{13}$C NMR spectra, which were obtained by direct polarization. The limited amount of film available precluded the use of direct polarization for $^{29}$Si NMR.

The narrowing effect of $^1$H decoupling is greatest for the peaks at 0, −6.4 and −15.5 ppm, indicating that these silicon environments are in the vicinity of hydrogen. The most intense of these peaks (−15.5 ppm) is assigned to the D unit [(O)$_2$Si*(CH$_3$)$_2$)] assuming a small shift relative to its —19 ppm position in spectra of films deposited from pure D$_3$. This downfield shift is attributed to the effect of electronegative CF$_2$ groups bonded to neighboring siloxane groups, and is consistent with the shifts observed in the FTIR spectrum of the copolymer [FIG. 4(a)]. Assuming a similar downfield shift, the peak at −6.4 ppm is assigned to the o-R$_3$ environment in the copolymer film.

The o-R$_3$ represents a ring structure of three siloxane units that is bound to the film structure by Si—Si bonds. The presence of these groups is attributed to a reaction pathway involving abstraction of one or more methyl groups in D$_3$ with retention of the ring structure. The absence of peaks at −9 and −19 ppm suggests that all of the siloxane ring structures have some degree of fluorocarbon substitution.

The peak at 0 ppm is assigned to linear siloxane units with two methyl groups and one CF$_2$ unit bonded to each silicon atom. The proposed bonding to CF$_2$ is consistent with the 0 ppm peak being the most prominent of the three peaks in this portion of the $^{19}$F cross-polarized and decoupled spectrum [FIG. 10 (b)]. Also, since the CF$_2$ group is less electronegative than oxygen, this moiety must lie between the M group (Me$_3$Si*O, typically observed at +6 ppm) and the D group (−15.5 ppm). Marsmann, H. In *NMR: Oxygen-17 and Silicon-29*; Diehl, P., Fluck, E., Kosfeld, R., Eds.; Springer-Verlag: New York, 1981; p 65. The combination of one CF$_2$ group and one oxygen atom would, however, cause the silicon atom to appear as Si+2 in the XPS. The FTIR band at 899 cm$^{-1}$ is probably due to the Si—C stretching mode in this moiety.

The peak at −92.0 ppm is most enhanced by $^{19}$F cross polarization and decoupling, indicating CF$_2$ and silicon in close proximity. This peak is assigned to the (O)$_2$Si*(CF$_2$)$_2$ moiety, since the large number of fluorine atoms would cause such an enhancement. The assignment is supported by the reported position of the (SiO)$_4$Si* (commonly known as 'Q') moiety in the literature (−105 to −110 ppm). Marsmann, H. In *NMR: Oxygen-17 and Silicon-29*; Diehl, P., Fluck, E., Kosfeld, R., Eds.; Springer-Verlag: New York, 1981; p 65. Replacing two of the oxygen atoms with less electronegative CF$_2$ groups would cause a downfield shift. The peak at −112.0 ppm is believed to be due to the (O)$_3$Si*(CF$_2$) moiety, which bears a close resemblance to the Q group. The peak is sharper in the $^{19}$F cross-polarized spectrum, indicating that it must be proximate to a fluorocarbon group. The oxidation state of silicon in (O)$_3$Si*(CF$_2$) is +3, and the intensity of the peak indicates that only a very small amount is present. This is probably why it is not easily resolvable in the Si(2p) high-resolution scan.

Figure 11:
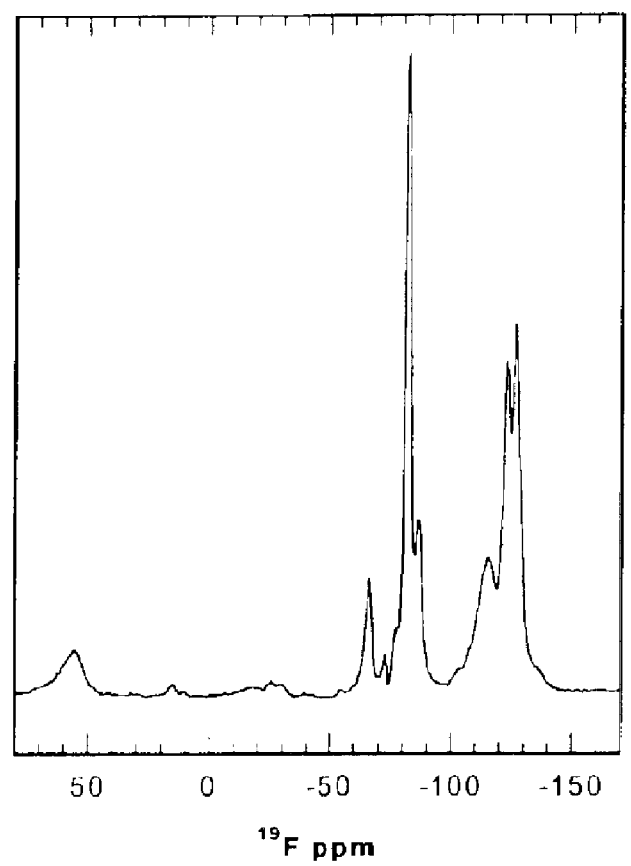
FIG. 11 depicts a solid-state $^{19}F$ NMR spectrum of the HFCVD film deposited from $V_3D_3$ and PFOSF at a filament temperature of 370° C. The feature at −72 ppm is a spectrometer artifact.

FIG. 11 shows the $^{19}$F NMR spectrum of a film deposited from V$_3$D$_3$ and PFOSF at a filament temperature of 370° C. Chemical shift assignments are given in Table 6. The peaks in this spectrum can be divided into three groups. The peaks between −140 and −100 ppm are due to fluorine atoms in CF$_2$ groups. The peaks between —100 and —50 ppm are due to fluorine atoms in CF$_3$ groups. The single peak at 55.6 ppm is due to fluorine atoms in SO$_2$F groups.

TABLE 6

Chemical Shift Assignments for the $^{19}$F Spectrum.

| Peak | Chemical Shift (ppm) | Structure | Area (arbitrary units) | Ref |
|---|---|---|---|---|
| (i) | 55.6 | CH(Si) SO$_2$F* | 25.86 | 17 |
| (ii) | −66.3 | CF$_3$*—CH$_2$ | 19.50 | 18 |
| (iii) | −82.1 | CF$_3$*CF$_2$CF$_2$ | 100.00 | 19, 20 |
| (iv) | −86.3 | CF$_3$*CF$_2$CH$_2$ | 21.63 | 18 |
| (v) | −112.0 | CF$_3$CF$_2$*CH$_2$ | 13.55 | 18 |
| (vi) | −115.5 | CH$_2$CF$_2$*CF$_2$ | 39.88 | 21 |
| (vii) | −123.5 | CF$_2$CF$_2$*CF$_2$ | 52.84 | 20 |
| (viii) | −127.0 | CF$_3$CF$_2$*CF$_2$ | 76.66 | 20 |

(17) Hollitzer, E.; Sartori, P. *J. Fluor. Chem.* 1987, 35, 329.
(18) Tanuma, T.; Irisawa, J. *J. Fluor. Chem.* 1999, 99, 157.
(19) Katoh, E.; Sugimoto, H.; Kita, Y.; Ando, I. *J. Mol. Struct.* 1995, 355, 21.
(20) Harris, R. K.; Jackson, P. *Chem. Rev.* 1991, 91, 1427.
(21) Itoh, T.; Maeda, K.; Shibata, H.; Tasaka, S.; Hashimoto, M. *J. Phys. Soc. Jpn.* 1998, 67, 23.

The pyrolysis of PFOSF results in the scission of the C—S bond, producing perfluorooctane radicals and sulfonyl fluoride radicals, as shown in Equation 1. The presence of CH$_2$CF$_2$*CF$_2$ (−115.5 ppm) in the $^{19}$F NMR spectrum suggests that the fluorocarbon radicals formed in this pyrolysis reaction react with the vinyl groups of V$_3$D$_3$, as indicated in Equation 2. This reaction pathway offers an explanation as to why PFOSF acts an initiator on V$_3$D$_3$ but not on D$_3$.

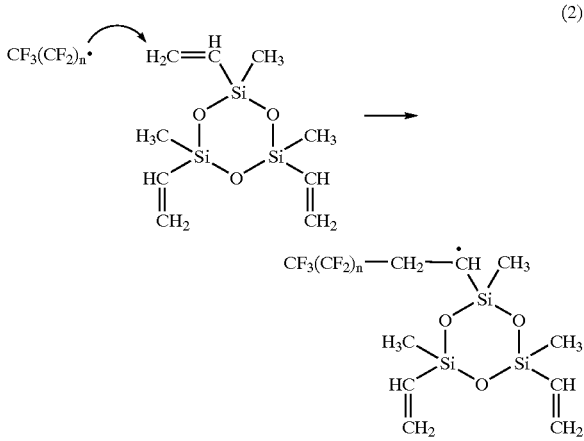

(2)

The greater width of the −115.5 ppm peak relative to the two other CF$_2$* peaks is attributed to the location of a second peak, the CF$_3$CF$_2$*CH$_2$ group, at −112.0 ppm. Tanuma, T.; Irisawa, J. *J. Fluor. Chem.* 1999, 99, 157. The accompanying CF$_3$*CF$_2$CH$_2$ shift is observed at −86.3 ppm. The validity of these assignments was verified using the integrated peak areas listed in Table 6. For internal consistency, the contribution of fluorine atoms to peak iv (peak area/3) was compared with the contribution to peak v (peak area/2). An additional calculation was performed to check the consistency of peaks associated with $CF_3$ groups directly bonded to $CF_2$ groups. The fluorine contribution to peaks iii and iv (sum of peak areas/3) was compared to the contribution to peaks v and viii (sum of peak areas/2). In both calculations the values under comparison were in agreement to within 10%, supporting the respective assignments.

The appearance of the $CF_3CF_2CH_2$ group and the $CF_3CH_2$ group suggest that some of the perfluorooctane radicals generated by the pyrolysis of PFOSF are capable of further breakdown as shown in Equation 3. These reactions could proceed by separation of $CF_2$ units from the perfluorooctane chains in the form of difluorocarbene. Alternatively, the $CF_2$ units could leave the chains in pairs, as tetrafluoroethylene. The radicals generated in these reactions could then react with $V_3D_3$ molecules by pathways analogous to Equation 2.

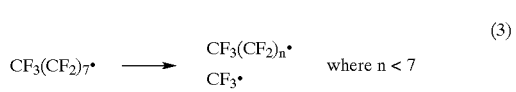

(3)

The chemical shift of fluorine atoms in $SO_2F$ groups is between 40 and 70 ppm and depends on the nature of atoms bonded to the sulfur atom. Banks, R. E. *Fluorocarbons and their Derivatives*, 2nd ed.; MacDonald Technical and Scientific: London, 1970; p 237. For instance, the chemical shift of $CF_2SO_2F^*$ is around 45 ppm, and that of $CH_2SO_2F^*$ is approximately 53 ppm. Hollitzer, E.; Sartori, P. *J. Fluor. Chem.* 1987, 35, 329. The peak at 55.6 ppm is assigned to a moiety similar to the latter, $CH(Si)SO_2F^*$. Moieties of this type would result from reactions between the free radicals generated per Equation 2 and $^{\bullet}SO_2F$ radicals. Since no sulfur-containing groups were observed presence of $SO_2F$ groups in these films suggests that the C—S bond is stronger when the substituents on the carbon atom are not electronegative. Pryce Lewis, H. G.; Caulfield, J. A.; Gleason, K. K. *Langmuir* 2001, 17, 7652.

Figure 12:
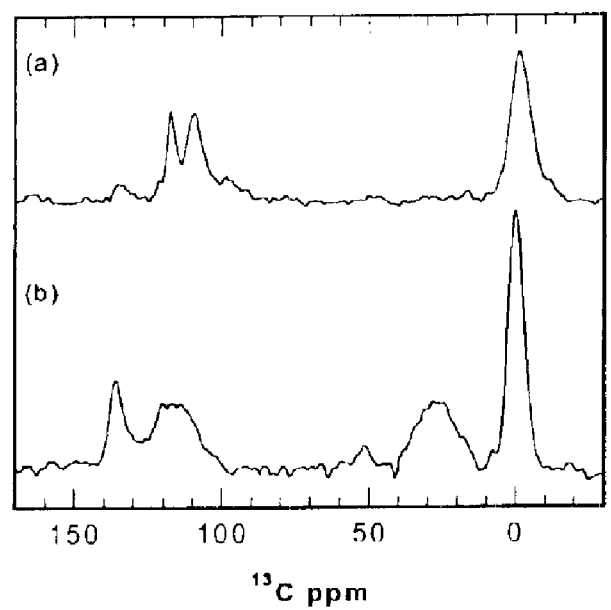
FIG. 12 depicts solid-state $^{13}C$ NMR spectra of the HFCVD film deposited from $V_3D_3$ and PFOSF at a filament temperature of 370° C. obtained with (a) $^{19}F$ decoupling and (b) $^1H$ decoupling.

FIG. 12 shows the $^{13}C$ NMR of the same film obtained with $^1H$ and $^{19}F$ decoupling. Chemical shift assignments for these spectra are given in Table 7.

TABLE 7

Chemical Shift Assignments for the $^{13}C$ NMR Spectra

| Chemical Shift (ppm) | Structure | Area (arbitrary units) | Ref |
|---|---|---|---|
| −2 to 0 | $CH_3$ | 281.30 | 23 |
| 12–41 | $CH_2$ and CH(Si) | 150.64 | 24 |
| 51.1 | CH(Si)—$SO_2F$ | 12.23 | 17 |
| 109 | $CF_2$ | 100.00 | 25 |
| 117 | $CF_3$ | 47.88 | 25 |
| 135 | Vinyl group | 88.38 | |

(17) Hollitzer, E.; Sartori, P. J. Fluor. Chem. 1987, 35, 329.
(23) Taylor, R. B.; Parbhoo, B.; Fillmore, D. M. In The Analytical Chemistry of Silicones; Smith, A. L., Ed.; Wiley-Interscience: New York, 1991, p 347.
(24) Pretsch, E.; Bühlmann, P.; Affolter, C. Structure Determination of Organic Compounds, 3rd ed.; Springer-Verlag: New York, 2000.
(25) Lau, K. K. S.; Gleason, K. K. J. Electrochem. Soc. 1999, 146, 2652.

In the absence of Equation 3, all of the perfluorooctane radicals produced by Equation 1 would contain 7 $CF_2$ groups for every $CF_3$ group. The $^{13}C$ NMR spectra indicate that the ratio of $CF_2$ groups to $CF_3$ groups is much smaller (approximately 2:1), providing support for further breakdown of these chains as given by Equation 3. The $CF_2/CF_3$ ratio calculated from the $^{13}C$ spectra is in quantitative agreement with that calculated from the $^{19}F$ spectrum. The latter ratio is given by (sum of all $CF_2^*$ peak areas/2)/(sum of all $CF_3^*$ peak areas/3). This calculation indicates that the $^{13}C$ spectra are consistent with the $^{19}F$ spectrum.

The broad peak between 12 and 41 ppm observed in the $^1H$-decoupled $^{13}C$ spectrum is absent in the $^{19}F$-decoupled spectrum, consistent with a hydrocarbon moiety with no fluorine atoms bonded to carbon. This peak lies in the region associated with $CH_2$ groups (5–45 ppm) as well as CH groups (25–60 ppm). Pretsch, E.; Bühlmann, P.; Affolter, C. *Structure Determination of Organic Compounds*, 3rd ed.; Springer-Verlag: New York, 2000. The presence of these groups suggests that the free radical species produced by the reaction between fluorocarbon radicals and $V_3D_3$ (Reaction 2) can react further with $V_3D_3$ molecules in a chain propagation step, as indicated in Equation 4. Here, "I" represents any initiator fragment produced per Equation 3.

(4)

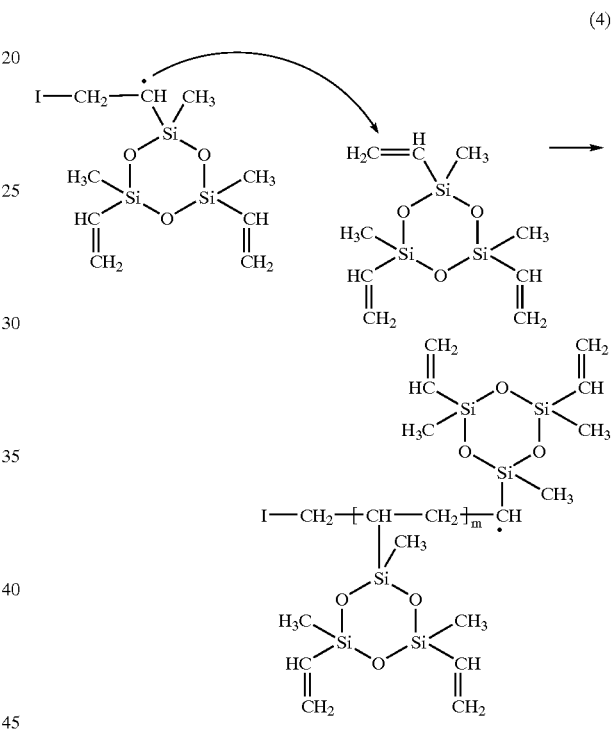

The chemical shifts of $CH_2$ groups and CH groups can vary significantly with position on a carbon backbone. In p-pentane, for instance, the chemical shifts of the first $CH_2$ group ($CH_3\underline{C}H_2CH_2CH_2CH_3$) and the second $CH_2$ group ($CH_3CH_2\underline{C}H_2CH_2CH_3$) are 22.8 ppm and 34.8 ppm respectively. Pretsch, E.; Bühlmann, P.; Affolter, C. *Structure Determination of Organic Compounds*, 3rd ed.; Springer-Verlag: New York, 2000. The width of the 12–41 ppm peak is thus consistent with carbon-backbone polymer chains of varying lengths.

The peak at 51.1 ppm is assigned to the $CH(Si)SO_2F$ moiety based on the reported shift for $\underline{C}H_2SO_2F$ (47.95 ppm by Hollitzer and Sartori). Hollitzer, E.; Sartori, P. *J. Fluor. Chem.* 1987, 35, 329. The presence of this peak in the $^{13}C$ NMR spectra is further evidence of reactions between the propagating radicals (produced per Equations 3 and 4) and $^{\bullet}O_2F$ radicals. These reactions would act as termination steps. Termination reactions could also occur by reactions between any fluorocarbon radicals and the propagating chains, or reactions between two propagating chains. The termination step is illustrated in Equation 5.

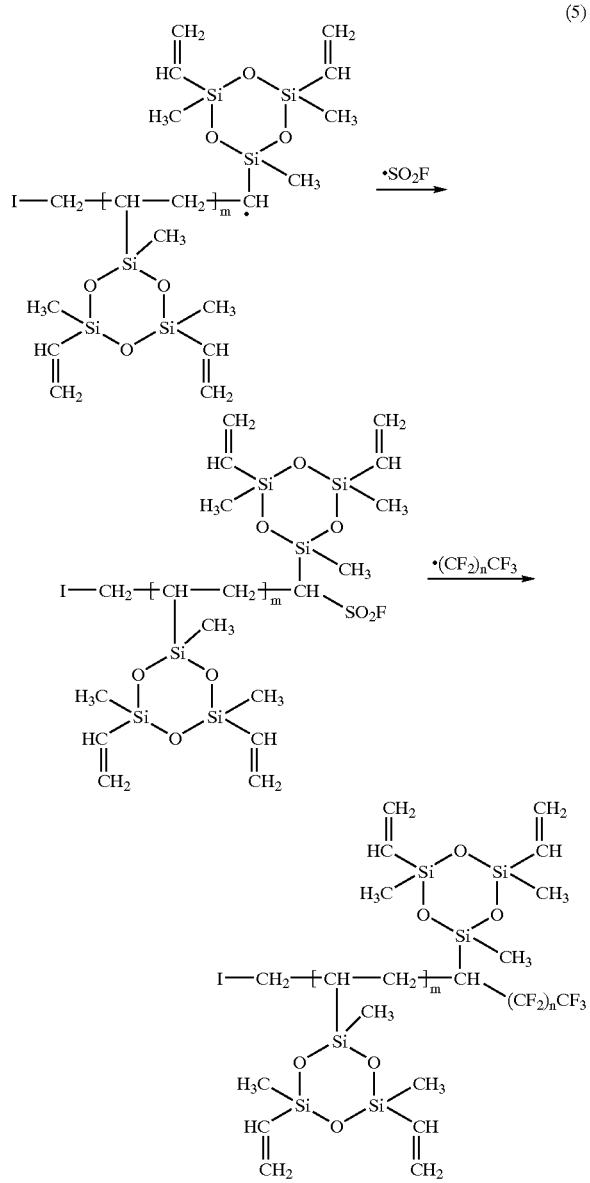

(5)

Figure 13:
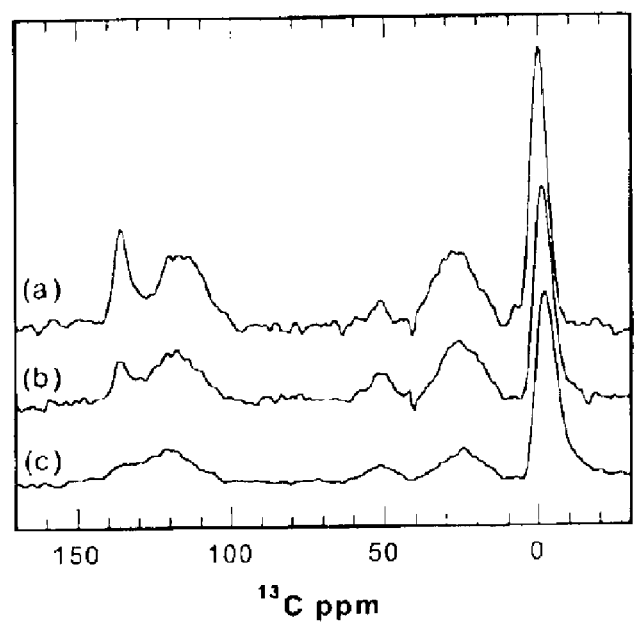
FIG. 13 depicts $^{13}C$ NMR spectra of the HFCVD films deposited from $V_3D_3$ and PFOSF at filament temperatures of (a) 370° C., (b) 440° C., and (c) 540° C.

FIG. 13 shows the $^{13}$C NMR spectra of the V$_3$D$_3$ films produced at three different filament temperatures. Chemical shift assignments for these spectra are given in Table 7. In our prior investigation of the chemical structure of films deposited at a filament temperature of 370 ° C.,[9] the peak between 12 and 41 ppm was shown to be evidence of carbon-backbone chains formed by polymerization across the vinyl bonds of V$_3$D$_3$ (Equation 4). Here, "I" represents a fluorocarbon initiator fragment produced by the thermal decomposition of PFOSF. S. K. Murthy, B. D. Olsen, K. K. Gleason *Langmuir* 18, 6424 (2002).

This peak decreases in intensity as the filament temperature is increased. The same trend is followed by the peak at 135 ppm, which corresponds to unreacted vinyl groups. If the vinyl groups in V$_3$D$_3$ were simply undergoing polymerization reactions per Equation 4, the decrease in intensity of the 135 ppm peak should be accompanied by an increase in the 12–41 ppm peak. Since this is not the case, the $^{13}$C NMR spectra indicate the possibility of vinyl group abstraction at higher filament temperatures.

Figure 14:
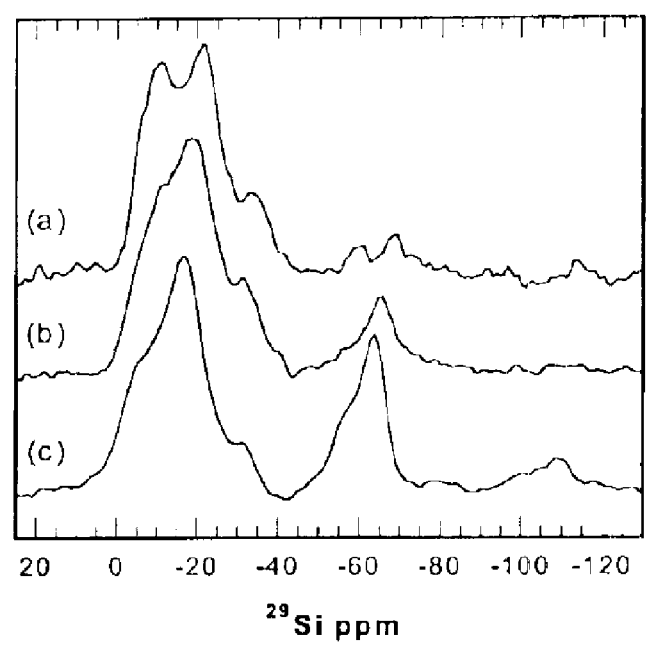
FIG. 14 depicts $^{29}Si$ NMR spectra of the HFCVD films deposited from $V_3D_3$ and PFOSF at filament temperatures of (a) 370° C., (b) 440° C., and (c) 540° C.
Figure 15A:
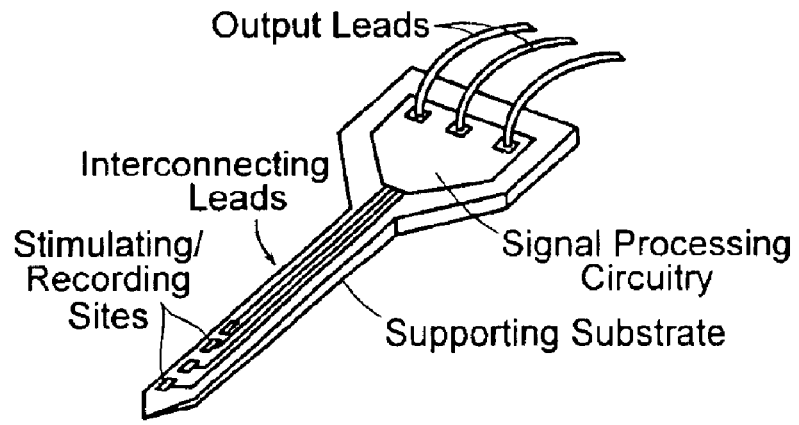
FIG. 15 depicts: a) the basic structure of an exemplary neural probe that bears a coating of the present invention and b) a neurological implant assembly.
Figure 15B:
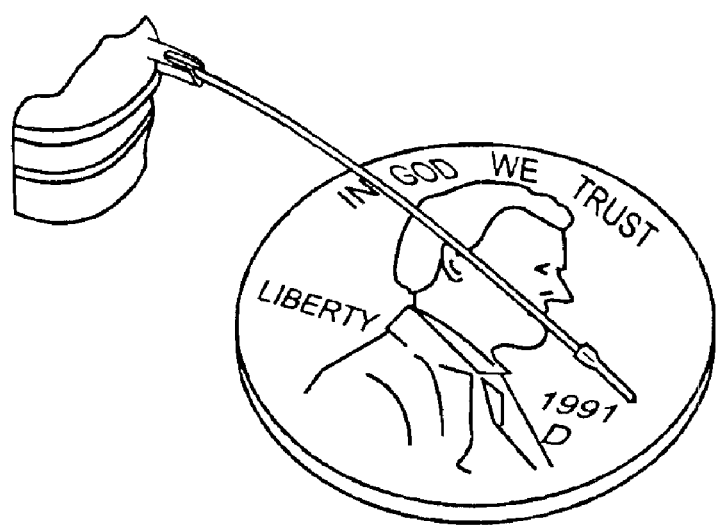
Figure 16:
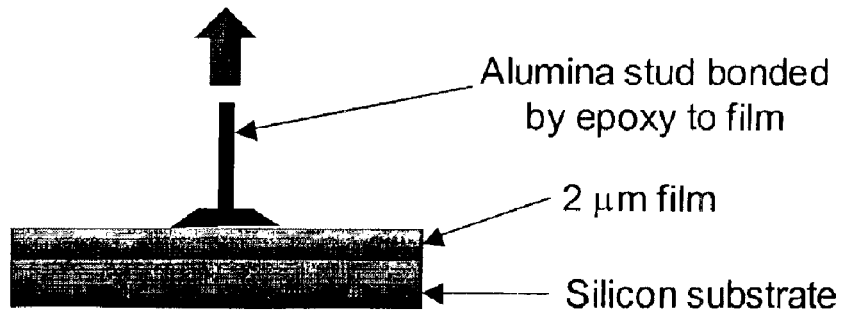
FIG. 16 depicts the "stud-pull" adhesion test used to quantify strength of the adhesion to a surface of a fluorocarbon-organosilicon copolymer film of the present invention.
Figure 17:
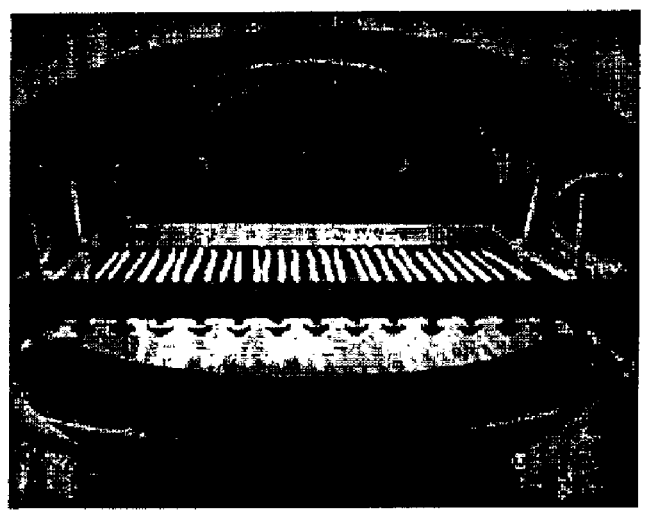
FIG. 17 depicts a CVD reactor and a hot filament array used to deposit the copolymer films of the present invention on a surface.
Figure 17:
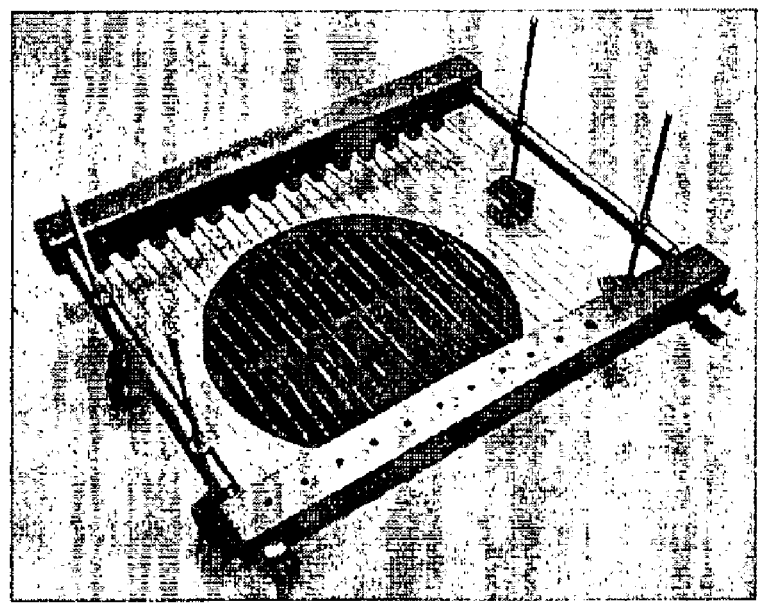

FIG. 14 shows $^{29}$Si NMR spectra of the same set of films, with peak assignments listed in Table 8.

TABLE 8

Chemical Shift Assignments for the $^{29}$Si NMR Spectra.

| Peak | Chemical Shift (ppm) | Structure |
|------|---------------------|-----------|
| i | −10.9 | ―[CH―CH$_2$]$_n$― with Si*(CH$_3$) in ring |
| ii | −16.4 | ―CH―CH$_2$― / O―Si*―CH$_3$ / O |
| iii | −21.9 | H$_2$C=CH―Si*(CH$_3$) in ring |
| iv | −31.0 to −33.7 | (CH$_3$)(O)$_2$Si*―CH=CH$_2$ (linear) |
| v | −63.7 to −69.2 | O―Si*(CH$_3$) with two O |
| vi | −108.4 to −114.0 | O―Si*―O with two O |

The most significant effect of increasing filament temperature is the increase in intensity of the peak located between −64 and −69 ppm. This peak is assigned to the (O)$_3$Si(CH$_3$) (commonly known as "T") group. Pryce Lewis, H. G.; Casserly, T. B.; Gleason, K. K. *J. Electrochem. Soc.* 2001, 148(12), F212. The formation of this moiety would require the abstraction of vinyl groups from the siloxane groups in V$_3$D$_3$, and is therefore consistent with the trend seen in the $^{13}$C NMR spectra. Abstraction of vinyl groups could proceed with the generation of ethylene, as shown in Equation 5.

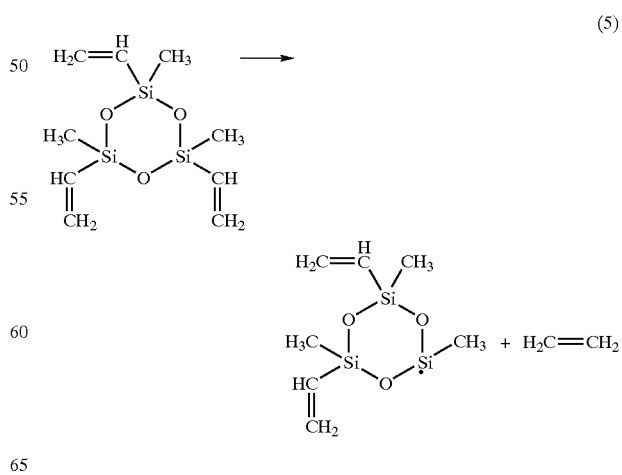

(5)

Another requirement for T group formation is the creation of a third Si—O bond. For this to occur, the six-membered siloxane rings would either have to open or break down. It is known that scission of the Si—O bond in cyclic siloxanes to produce diradicals of the form $Si(CH_3)_2(OSi[CH_3]_2)_nO^\bullet$ is unlikely. L. E. Guselnikov, N. S. Nametkin *Chem. Rev.* 79, 529 (1979); and M. G. Voronkov *J. Organomet. Chem.* 557, 143 (1998). It is therefore postulated that the first step in T group formation is the breakdown of the six-membered ring to yield a dimer and monomer as illustrated in Equation 6.

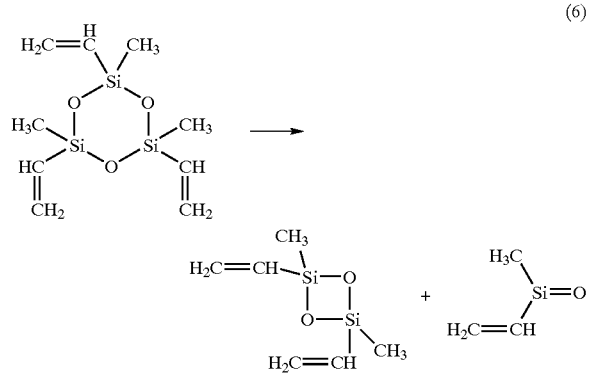

(6)

This postulate is made on the basis of generalized thermal decomposition pathways described for peralkylcyclosiloxanes by Voronkov. M. G. Voronkov *J. Organomet. Chem.* 557, 143 (1998). In the scheme proposed for hexamethylcyclotrisiloxane, the six-membered ring decomposes into a dimer and monomer, and the highly unstable dimer subsequently breaks down into two monomer units. In the case of $V_3D_3$, such a pathway would yield a total of three vinylmethylsilanone molecules.

The second step in the formation of T groups would then be reaction of vinylmethylsilanone with a vinyl-abstracted siloxane group, as shown in Equation 7.

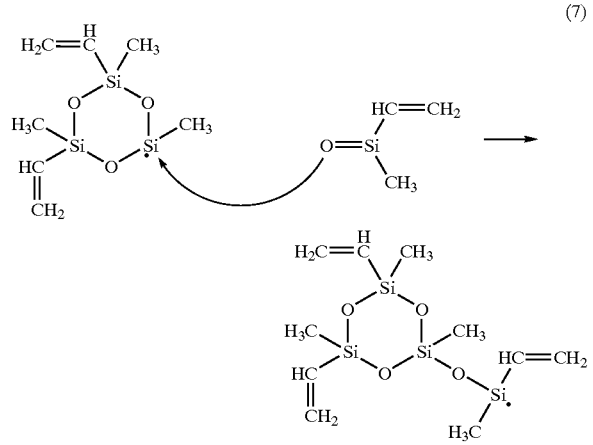

(7)

The radical species produced by this reaction could undergo propagation reactions with other dimethylsilanone molecules, or termination reactions with fluorocarbon radicals. The $^{29}Si$ NMR spectrum of the precursor $V_3D_3$ contains only one peak at −22 ppm. This peak appears in the spectrum of the film deposited at the lowest filament temperature (FIG. 14a), and is assigned to the vinylmethylsiloxane group in a ring structure of three siloxane units. Also present in FIG. 14a is a peak at −10.9 ppm, which is assigned to the siloxane group in a pendant ring that is directly bonded to a carbon-backbone chain (peak i in Table 8; see reaction 4). Since both of the carbon atoms attached to the silicon atom of interest in this moiety are $sp^3$ hybridized, its chemical shift is close to the −10 ppm shift reported for the dimethylsiloxane groups in hexamethylcyclotrisiloxane. Pryce Lewis, H. G.; Casserly, T. B.; Gleason, K. K. *J. Electrochem. Soc.* 2001, 148(12), F212. As the filament temperature is increased, these two peaks are replaced by a single peak at −16.4 ppm. This peak is assigned to the linear-siloxane chain version of the $(CH_2)CH$—$Si(O)_2(CH_3)$ group. Similarly, peak iv represents the vinylmethylsiloxane group in a linear chain. T. Zundel, J. M. Yu, L. Lestel, D. Teyssie, S. Boileau *Macromol. Symp.* 88, 177 (1994). The concentration of vinyl groups is highest in FIG. 14a (as evidenced by the presence of the −22 ppm peak and the intensity of the −33.7 ppm peak), a result that is consistent with the $^{13}C$ NMR data.

The peaks between −10 and −34 ppm indicate that the siloxane groups in the films are primarily in the form of rings when the filament temperature is low. At higher filament temperatures, these groups are mainly in linear chains. The proposed mechanism for the conversion of six-membered siloxane rings into linear chains is via equation 6 and subsequent reaction of the vinylmethylsilanone molecules to form linear siloxane chains as shown in Equation 8. These chains could also undergo vinyl-abstraction reactions and form cross-links via T groups in pathways analogous to Equations 5 and 7.

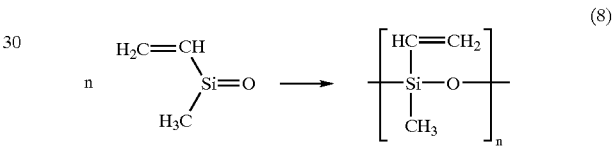

(8)

Film Properties
Biopassivation

Biopassivating coatings, i.e., coatings that insulate an article and render it impervious to its biological environment, are generating an increased amount of attention as many biomedical and other applications are not optimally addressed by available coatings in the art such as polytetrafluoroethylene, also known as PTFE, $(CF_2)_n$, and Teflon™, for example. Biologically-implantable devices such as neural probes, catheter inserts, implantable tubing, and other such devices, all of which are becoming increasingly complicated in geometry, are preferably encapsulated with a film to render the devices impervious to a biological environment, rather than being housed in a bulky PTFE package structure. Such implantable devices typically require of an encapsulating film not only the desired biological compatibility, but due to complex topology and connections to lead wires and associated circuitry, also inherently require an encapsulating film to be conformal and thin, as well as electrically insulating, tough, and flexible. Such a film should further be a good permeation barrier against the implantation environment. The fluorocarbon-organosilicon copolymer coatings of the present invention show improved biopassivation properties over the organosilicon polymers alone in saline soaking tests. Additionally, the fluorocarbon-organosilicon copolymer coatings have lower dielectric constants and increased hydrophobicity relative to organosilicon coatings alone. All of which favors increased biopassivation.

Rigidity/Flexibility as a Factor of Crosslinking

The flexibility of the copolymer coatings of the present invention makes them ideally suited for the many applications listed below. For instance it would not be desirable to have coated wires in biomedical applications that are brittle and flake under strain. In this area, organosilicon coatings have been lacking, but fluorocarbon coatings have performed well. By copolymerizing the organosilicon and fluorocarbon active species, the coatings of the present invention improve upon the flexibility of organosilicon coatings alone.

Coating rigidity/flexibility is a function of the amount of crosslinking between the polymer chains. HFCVD is advantageous over plasma enhanced chemical vapor deposition (PECVD) in this regard as fewer number of side reactive species capable of forming crosslinking bonds are formed during HFCVD. Further, lower filament temperature results in less crosslinking and therefore less rigidity and brittleness. The present invention, therefore, offers a way of tuning the degree of flexibility according to the application by adjusting the filament temperature.

Various techniques may be used to quantify the degree of crosslinking in a coating of the present invention. For example, peak area calculations using $^{29}$Si NMR data may be used. However, the $^{29}$Si NMR spectra must have been acquired without cross-polarization in order for the data to useful for quantification of crosslinking. Nevertheless, even if the spectral data was acquired with cross-polarization, a qualitative assessment of crosslinking can be made by comparing peak areas within a spectrum. For example, if a film has a large number of crosslinking groups, e.g., $(O)_3Si(CF_2)$, relative to other groups, then significant crosslinking can be inferred.

The flexibility of the coatings of the present invention may be quantified using the technique of nano-indentation. This technique enables the measurement of the modulus and toughness of thin films.

Adhesion

A useful film has to have good adherence to the surface upon which it is coated. In this regard organosilicon films have performed well but fluorocarbon films have been lacking. It is therefore expected that a copolymer film between fluorocarbons and organosilicons will improve adherence over fluorocarbon films alone. Indeed, this is what is observed. In adhesion tests using a stud-pull tester to measure adhesion, 2 micron films were deposited on silicon wafers via HFCVD. Copolymer films of two compositions were analyzed: fluorocarbon-rich and organosilicon-rich. The results are presented in Table 9 below.

TABLE 9

Adhesion values for various polymers and copolymers.

| | | Fluorocarbon-Organosilicon Copolymer Film | | |
|---|---|---|---|---|
| | Fluorocarbon Film | Fluorocarbon Rich | Organosilicon Rich | Organosilicon Film |
| Adhesion (× 1000 psi) | 0.00 | 0.30 | 0.74 | 0.53 |

As expected, bonding of the organosilicon film is better than the fluorocarbon film, and the copolymer film shows improved adhesion over the fluorocarbon film. Additionally, the organosilicon-rich copolymer film showed improved adhesion over the organosilicon film. Variation with composition suggests that adhesion can be tuned to a desired level by adjusting composition feed into the HFCVD reactor.

Supercritical $CO_2$ Solubility

Processing used in microelectronics is increasingly designed with environmental impact in mind. As technologies change, new process insertion points occur. The role of copolymers in microelectronics has traditionally been confined to photoresist materials, but is expanding to include low dielectric constant (low-κ) materials. By merging the role of resist and dielectric materials, the fluorocarbon-organosilicon copolymer films can be used as directly patterned low-κ dielectric films. Super critical carbon dioxide (SCF $CO_2$) is a promising development medium for fluorocarbon-organosilicon copolymer resists. Similar to other fluorine-containing materials, the fluorocarbon-organosilicon copolymers are insoluble in aqueous developers. Performance enhancement is possible with SCF $CO_2$ due to the unique properties of the supercritical phase, including low viscosity, negligible surface tension, high diffusivity relative to the gas phase, and a density similar to that of the liquid phase. The solvating capability of SCF $CO_2$ towards the fluorocarbon-organosilicon copolymer films can be fine-tuned by temperature and pressure control. We have found SCF $CO_2$ suitable as a developer for HFCVD fluorocarbon-organosilicon system, as well as for fluorinated resists patterned with small and high aspect ratio features that may otherwise experience pattern collapse due to surface tension from aqueous developers. Combined, HFCVD film formation and dry development present a unique processing combination with impressive environmental and safety advantages over current solvent-based spin-on coating and aqueous development. Solvent-based technologies typically generate large quantities of liquid waste that is hazardous and costly to dispose of HFCVD techniques generate only gaseous effluent and CVD chemistries can be designed to minimize the toxicity of this effluent. $CO_2$ is non-toxic, non-flammable, recyclable material that is typically collected from waste-streams of other synthetic processes and is available at a low cost with no waste generation.

Multilayer Approach

The advantage of HFCVD deposition of a fluorocarbon and organosilicon to form a fluorocarbon-organosilicon copolymer upon a structure surface is that the fluorocarbon-organosilicon copolymer combines the desirable properties of the fluorocarbon with the desirable properties of the organosilicon. In the case of fluorocarbons, those properties include low dielectric constants, high resistivity, low surface energy, high hydrophobicity, and flexibility. In the case of organosilicons, the desirable properties include superior thermal stability, better adhesion to silicon substrates, smooth films, and they are suitable for implantations. However, both individual coatings also possess undesirable properties. Fluorocarbons have high degrees of roughness and poor adhesion to silicon substrates. Organosilicons have lower resistivity and higher dielectric constants.

A multilayer approach would not only be able to exploit the advantageous properties of both types of coatings more effectively, but is also particularly well suited to CVD techniques. In a multilayer approach, only one gaseous monomer would initially be fed into the HFCVD chamber depositing a first layer upon a structure surface. In one embodiment a pure organosilicon layer would be deposited upon a surface to take advantage of its superior adhesion properties. Next, the composition of the feed gas would be varied to include a fluorocarbon so that the next layer is a fluorocarbon-organosilicon copolymer. The composition of the feed gas would then be varied again resulting in an outer layer of just the fluorocarbon polymer to take advantage of its high resistivity, low surface energy, and high hydrophobicity. In the multilayer method the hybrid interlayer is for compatibility between the outer organosilicon and fluorocarbon layers. Compositional changes can be made by varying the feed gas and process conditions in real time offering the potential for a wide range of coating properties.

Exemplary Organosilicon and Halocarbon Monomers

An organosilicon monomer used in a method of the present invention may be selected from the group of suitable organosilicons. For example, the organosilicon monomer used may be hexamethylcyclotrisiloxane, octamethylcyclotetrasiloxane, 1,3,5-trivinyl-1,3,5-trimethylcyclotrisiloxane, 1,3,5,7-tetravinyl-1,3,5,7-tetramethylcyclotrisiloxane, 3-(N-allylamino)propyltrimethoxysilane, allyldichlorosilane, allyldimethoxysilane, allyldimethylsilane, allyltrichlorosilane, allyltrimethoxysilane, allyltrimethylsilane, bis(dimethylamino)vinylmethylsilane, para-(t-butyldimethylsiloxy)styrene, decamethylcyclopentasiloxane, diethylsilane, dimethylethoxysilane, dimethylsilane, divinyldimethylsilane, divinyltetramethyldisilane, 1,3-divinyltetramethyldisiloxane, ethyltrimethoxysilane, hexamethyldisiloxane, 1,1,3,3,5,5-hexamethyltrisiloxane, hexavinyldisiloxane, methyltriethoxysilane, methyltrimethoxysilane, methylsilane, tetraethoxysilane, tetraethylcyclotetrasiloxane, tetraethylsilane, tetramethoxysilane, 1,1,3,3-tetramethyldisiloxane, tetramethylsilane, tetravinylsilane, trimethylsilane, vinyldimethylsilane, vinylmethylbis(trimethylsiloxy)-silane 3-vinylheptamethyltrisiloxane, vinylmethyldiethoxysilane, vinyloxytrimethylsilane, vinylpentamethyldisiloxane, vinyltetramethyldisiloxane, vinyltrimethoxysilane, or vinyltrimethylsilane.

A halocarbon monomer used in a method of the present invention may be selected from the group of suitable halocarbons. For example, the halocarbon monomer used may be hexafluoropropylene oxide, tetrafluoroethylene, hexafluorocyclopropane, octafluorocyclobutane, perfluorooctanesulfonyl fluoride, octafluoropropane, trifluoromethane, difluoromethane, difluorodichloromethane, difluorodibromomethane, difluorobromomethane, difluorochloromethane, trifluorochloromethane, tetrafluorocyclopropane, tetrachlorodifluorocyclopropane, trichlorotrifluoroethane, or dichlorotetrafluorocyclopropane.

Film Applications

The film properties discussed above and the method of preparing the thin fluorocarbon-organosilicon copolymer films on a structure surface lend themselves to varied array of applications. The unique properties of the fluorocarbon-organosilicon copolymer film and the ambient temperature at which the structure is coated allow for applications ranging from biomedical devices to clothing. Below is a table listing selected applications of the thin copolymer films of the invention.

TABLE 10

Selected applications of the current invention

General Category

Application
Biomedical

Filters/Membranes, DNA Microarrays, BioChips, Functional Membranes, 96-Well Trays, Centrifuges TABLE 10-continued Selected applications of the current invention Optics Optical Waveguides and Communication, Optical Filters, Optic Fibers
Medical Medical Blades, Surgical Sutures, Syringes, Fine Wires-Pacemakers, Neural Probes, Inhalers, Stents, Needles, Filters/membranes, Forceps, Endoscopic Tools
Kitchenware Roasters, Quiche Pans, Pressure Pots, Poultry Cookers, Pots, Pizza Pans, Microwave Browning Trays, Breadmaker Pans, Bakeware, Egg Rings, Knives, Ladles Ice Trays, Sandwhich Makers, Shot Glasses, Spatulas, Spoons, Stock Pots, Stovetops, Waffle Irons, Utensils, Beaters
Cutting Edges (Reduced Force)

Razor Blades, Knives, Scissors, Pruners
Microfluid Delivery

Microcontact Printing, Ink-jet Printer Parts
Government Projects

Ferroelectrics, NASA Specifications
Hydrophobic "Self Cleaning" and Waterproofing Surfaces Stain-proof Fabrics, Sleeping Bags, Tents, Waterproof Clothing, Condensers-for drop-wise condensation, Shoes, Hats, Swim Suits, Eye-glasses, Windows-home, Car Windshield, Plane Windows, Watch Parts, Display Glass/Plastic, Coatings for Tiles/Metals, Rugs/Carpets
Reduced Fiction/Drag Reduction Applications Underside of Ships, Waterslides, Skies/Snowboards, Ice-skates/Sleds, Propellers, Golf Balls, Swimming Caps, Lubrication of Motors, Dental Floss, Bearing Housings, Bearings, Agitators, Pistons, Saw Blades, Fan Blades, Hinge Pins, Knuckle Joints, Chutes, Toggle Joints
Non-Stick Surfaces and Containers Molds/Casts, Low Temp Cookware, High Temp Cookware, Catheters, Antigraffiti Surfaces, Reactor Coatings, Reactor Windows, Bottles, Drip Pans, Glue Pans, Ink Pans, Ink Trays, Oil Pans
Corrosion Resistant Screws, Nails, Bolts, Nuts, Rivets, Clamps, Gears, Gaskets, Dry Vents, Exhaust Systems, Springs, Water Valves, Wire Cloth, Wire Goods
Anti-fog Goggles, Mirrors, Windows
Anti-fouling Heat Exchangers/Air Conditioners/Refrigerators, Coatings on the Inside of Tubes and Pipes, Seals-Valves, "O" Rings
Protective Coating Coating on the Outside of Wires/Fibers/Cables, Sensors, Protective Coating on Art, Toys, Microelectronics, Particles and Fibers for Composite/Reinforced Materials, Antistiction/Seals MEMS, X-ray Tubes, Zippers, Insulators, Lavatory Bowls
Generalized Mechanical Systems Jet Engine Components, Turbo Pump Components, Chemical Processing Equipment, Dairy Process Equipment, Marine Components, Power Tool Components, Photocopier Parts, Printing Equipment Pump Components, Web Press Parts, Automotive Components

EXEMPLIFICATION

The invention now being generally described, it will be more readily understood by reference to the following examples, which are included merely for purposes of illustration of certain aspects and embodiments of the present invention, and are not intended to limit the invention.

General Spectroscopic Methods

Fourier-transform infrared (FTIR) spectroscopy was performed on the deposited films using a Nicolet Magna 860 spectrometer or a Nicolet nexus 870 spectrometer in transmission mode. The spectra were baseline corrected and normalized to a thickness of approximately 7000 Å. X-ray photoelectron spectroscopy (XPS) was carried out on a Kratos Axis Ultra spectrometer using a monochlromatized aluminum K-α source.

Solid-state NMR spectroscopy was performed on a home-built spectrometer comprising a 6.338 T Oxford superconducting magnet and a 3.2 mm Chemagnetics magic angle sample spinning (MAS) probe. For this analysis, approximately 14 mg of film was scraped off wafers from nine 30-min depositions, and packed into a zirconia rotor of 11 mm$^3$ internal volume. Sample spinning at the magic angle of 54.7° was performed in order to mitigate spectral broadening due to strong homonuclear dipolar and anisotropic chemical shift effects. The sample spinning speeds were 5 kHz, 25 kHz and 10 kHz for $^{29}$Si, $^{19}$F and $^{13}$C respectively.

$^{29}$Si NMR was performed with proton cross-polarization (CP) and proton decoupling to enhance the signal and resolution from the low natural abundance $^{29}$Si nuclei. The $^1$H-$^{29}$Si CP time was 5 ms and the 90° pulse width was 1.3 µs. $^{29}$Si spectra were also obtained with fluorine cross-polarization and fluorine decoupling. The purpose of this was to determine which silicon atoms were in close proximity (<10 Å) to fluorine-containing moieties. Contact time experiments indicated that a CP time of 5 ms was sufficient to maximize signal intensity. The 90° pulse width for these measurements was 1.2 µs. $^{29}$Si chemical shifts were externally referenced to tetramethylsilane.

$^{19}$F NMR spectra were obtained by direct polarization with a 90° pulse width of 1.2 µs. Chemical shifts were externally referenced to trichlorofluoromethane. $^{13}$C spectra were obtained by direct polarization with proton decoupling as well as direct polarization with fluorine decoupling. The 90° pulse width was 1.8 µs for both types of spectra. $^{13}$C chemical shifts were externally referenced to tetramethylsilane.

Deposition Methods

Start Up Procedure

Prior to each experiment, the interior of the deposition chamber was cleaned thoroughly with paper towels and Scotch Brite soaked in acetone or isopropanol. The filament wire was then strung onto the holder, and the holder was placed inside the reactor and connected to the power supply. The chamber was then evacuated.

The filament voltage was then raised to 86.5V over a 5 min span. HFPO was then flowed into the chamber at a rate of 30 sccm with the chamber pressure maintained at 1 Torr for 20 min. The chamber was then evacuated, and the filament power was turned down over a 5 min span.

After turning off the power the filament completely, the chamber was pumped up to atmospheric pressure. The filament holder was removed, and the interior of the chamber was cleaned as described above.

The substrate and filament holder were then placed on the stage. The filament holder was then connected to the power supply and the chamber was pumped down to vacuum. Filament power was raised to 86.5V over a 5 min span. The valve on the D3 line was opened to the appropriate setting, followed by the valve on the HFPO line. The chamber pressure was then set to 1 Torr.

Depositing the Copolymer Film

Depositions were performed in a custom-built vacuum chamber on to silicon wafer substrates. Pressure within the chamber was controlled by a butterfly valve connected to a PI coontroller. Substrates were placed on a stage maintained at a low temperature (15±5° C.) by the circulation of chilled water through internal coils. Precursor breakdown was achieved by means of a resistively heated nichrome (80% nickel, 20% chromium; Omega Engineering) wire 0.038 cm in diameter. The frame holding the filament wire was equipped with springs to compensate for thermal expansion of the wire upon heating. The distance between the filament wire and the substrate was 1.4 cm. Filament temperature was measured by a 2.2 µm infrared pyrometer. The spectral emissivity was estimated to be 0.85 based on direct contact thermocouple experiments.

Fluorocarbon and D$_3$ Copolymer

The flow of fluorocarbon precursor, hexafluoropropylene oxide gas (HFPO), into the chamber was controlled by an MKS Model 1295C Mass Flow Controller (MFC). The silicone precursor, hexamethylcyclotrisiloxane (D$_3$) was vaporized in a stainless steel vessel that was heated to 90±5° C. The lines leading from the vessel to the vacuum chamber were maintained at 130±5° C. Flow of vapor from the vessel into the chamber was regulated by a needle valve.

Depositions were performed at a filament temperature of 620° C. and a chamber pressure of 1 Torr. Precursor flow rates were 20 sccm for HFPO and 28 sccm for D$_3$. The duration of these depositions ranged between 10 min and 30 min. The deposition rate, determined by profilometry, was approximately 250 Å/min.

PFOSF Initiated V$_3$D$_3$ Polymerization

Film depositions were carried out in a custom-built vacuum chamber described previously. Precursor breakdown was achieved by use of a resistively heated 0.038-cm-diameter Nichrome wire (80% nickel, 20% chromium; Omega Engineering). The filament temperature was measured using a 2.2 µm infrared pyrometer with a spectral emissivity of 0.85. V$_3$D$_3$ (Gelest) was vaporized in a stainless steel vessel that was heated to 110±5° C. and fed to the reactor through a line maintained at 140±5° C. PFOSF (Aldrich) was vaporized in a glass container held at 60±5° C. and fed through a line held at 90±5° C. The flow of both V$_3$D$_3$ and PFOSF into the reactor was regulated by needle valves. Depositions were carried out at a range of filament temperatures between 350 and 540° C. with a chamber pressure of 0.5 Torr. For all depositions, the flow rates of V$_3$D$_3$ and PFOSF were 23 sccm and 12 sccm respectively. The stage supporting the substrate was maintained at 25±2° C. Film thickness was measured by profilometry, using a Tencor P-10 Surface Profiler.

For thermogravimetric analysis (TGA), films were deposited on silicon wafers at filament temperatures of 370, 440, and 540° C. For chemical characterization by solid-state nuclear magnetic resonance (NMR) spectroscopy and thermal stability studies by thermogravimetric analysis (TGA), longer duration depositions (approximately 60 minutes long) were carried out to prepare 14–16 mg samples for each of the three filament temperatures. Sample preparation for TGA was done by scraping films off wafers and loading into a platinum pan covered with aluminum foil. TGA was performed on a Perkin Elmer TGA 7 analyzer using nitrogen as the purge gas with a flow rate of 20 ml/min. Samples were held at 40° C. for 3 min and then heated to approximately 450° C. at a rate of 10° C./min.

Films were also deposited on 50-µm-diameter platinum wires (A–M Systems). These wires were mounted on an aluminum ring with posts, and the distance between the wires and the reactor stage was 0.5 cm. The distance between the substrate wires and the Nichrome filament was 1.8 cm. The structure of the coatings was observed using a FEI/Philips XL30 environmental scanning microscope (ESEM).

Shut Down Procedure

The filament power was turned down rapidly (in less than 10 sec) with the precursors still flowing. The D3 valve was then closed, then the HFPO valve. Chamber was then evacuated to base pressure, and then pumped up to atmospheric pressure.

Adhesion Testing

The instrument used is a Sebastian I Adherence Tester made by Quad Group, and the procedure is as follows. The samples being analyzed were typically cut into 2 cm$^2$ pieces. 2.7 mm epoxy coated aluminum pull studs (also supplied by Quad Group) were secured onto the test surface by means of clips. The sample was then placed in an oven to cure the epoxy at a temperature of 150 degrees C. for about 1 hour. The sample was then allowed to cool to room temperature. The sample was then mounted onto the adherence tester. The device clamped the stud and pulled it with a measured force until the stud was pulled off the sample surface.

Incorporation by Reference

All of the patents and publications cited herein are hereby incorporated by reference.

Equivalents

Those skilled in the art will recognize, or be able to ascertain using no more than routine experimentation, many equivalents to the specific embodiments of the invention described herein. Such equivalents are intended to be encompassed by the following claims.

We claim:

1. A method for forming a copolymer thin film on surface of a structure, comprising the steps of:

exposing at least two monomer gasses selected independently from the group consisting of organosilicons and halocarbons to a source of heat having a temperature sufficient to pyrolyze the monomer gasses, the monomer gases selected to produce upon pyrolysis sources of reactive species that include polymerizable species and that selectively promote copolymerization, the reactive species sources being in the vicinity of a structure surface on which a copolymer thin film is to be formed; wherein halocarbons are selected from the group consisting of hexafluoropropylene oxide, tetrafluoroethylene, hexafluorocyclopropane, octafluorocyclobutane, perfluorooctanesulfonyl fluoride, octafluoropropane, trifluoromethane, difluoromethane, difluorodichloromethane, difluorodibromomethane, difluorobromomethane, difluorochloromethane, trifluorochloromethane, tetrafluorocyclonronane, tetrachlorodifluorocyclopropane, trichlorotrifluoroethane, and dichlorotetrafluorocyclopropane; and maintaining the structure surface at a substantially lower temperature an that of the heat source to induce deposition and polymerization of the reactive species on the structure surface.

2. The method of claim 1, wherein one of the monomer gassed is an organosilicon.

3. The method of claim 2, wherein the halocarbon is hexafluoropropylene oxide and the organosilicon is selected from the group consisting of hexamethylcyclotrisiloxane ($D_3$) and octamethylcyclotetrasiloxane ($D_4$).

4. A halocarbon organosilicon copolymer coating prepared by the method of claim 2.

5. The method of claim 1, wherein the halocarbon is hexafluoropropylene oxide.

6. The method of claim 2, wherein the organosilicon is selected from the group consisting of hexamethylcyclotrisiloxane ($D_3$) and octamethylcyclotetrasiloxane ($D_4$).

7. The method of claim 1, wherein the heat source to which the monomer gasses are exposed comprises a resistively-heated conducting filament suspended above the structure surface.

8. The method of claim 1, wherein the heat source to which the monomer gasses are exposed comprises a heated plate having a pyrolysis surface that faces the structure.

9. The method of either claim 7 or 8, wherein the heat source temperature is greater than about 400K, and wherein the step of maintaining the structure surface temperature comprises maintaining the structure surface at a temperature less than about 300K.

10. The method of claim 1, wherein the structure comprises a length of wire.

11. The method of claim 1, wherein the structure microfabrication comprises a substrate.

12. The method of claim 11, wherein the structure microfabrication is an electronic circuit including at least one conducting layer having a fluorocarbon-organosilicon copolymer thin film of less than about 20 microns in thickness thereon.

13. The method of claim 1, wherein the structure comprises a neural probe.

14. The method of claim 1, wherein the structure comprises a razor blade.

15. The method of claim 1, wherein the structure comprises a microstructure having multiple surfaces all of which are maintained at a substantially lower temperature than that of the heat source.

16. A copolymer coating prepared by the method of claim 1.

17. A method of forming a multilayer copolymer in film on a surface of a structure, comprising the sequential steps of:

a) exposing a monomer gas to a source of heat having a temperature sufficient to pyrolyze the monomer gas, the monomer gas selected to produce upon pyrolysis a source of reactive species that selectively promotes polymerization, the reactive species being in the vicinity of a structure surface on which a polymer thin film is to be formed; and maintaining the structure surface at a substantially lower temperature than that of the heat source to induce deposition and polymerization of the reactive species on the structure surface;

b) exposing at least two monomer gasses selected independently from the group consisting of organosilicons and halocarbons to a source of heat having a temperature sufficient to pyrolyze the monomer gasses, the monomer gasses selected to produce upon pyrolysis sources of reactive species that include polymerizable species and that selectively promote copolymerization, the reactive species sources being in the vicinity of the coated structure surface from step a) on which a copolymer thin film is to be formed; and maintaining the coated structure surface from step a) at a substantially lower temperature than that of the heat source to induce deposition and polymerization of the reactive species on the coated structure surface; wherein halocarbons are selected from the group consisting of hexafluoropropylene oxide, tetrafluoroethylene, hexafluorocyclopropane, octafluorocyclobutane, perfluorooctanesulfonyl fluoride, octafluoropropane, trifluoromethane, difluoromethane, difluorodichloromethane, difluorodibromomethane, difluorobromomethane, difluorochloromethane, trifluorochloromethane, tetrafluorocyclonronane, tetrachlorodifluorocyclopropane, trichlorotrifluoroethane, and dichlorotetrafluorocyclopropane; and c) exposing a monomer gas to a source of heat having a temperature sufficient to pyrolyze the monomer gas, the monomer gas selected to produce upon pyrolysis a source of reactive species that selectively promotes polymerization, the reactive species being in the vicinity of the coated structure surface from step b) on which a polymer thin film is to be formed; and maintaining the coated structure surface from step b) at a substantially lower temperature than that of the heat source to induce deposition and polymerization of the reactive species on the coated structure surface.

18. The method of claim 17, wherein one of the at least two monomer gasses is a halocarbon.

19. The method of claim 17, wherein one of the at least two monomer gasses is an organosilicon.

20. The method of claim 17, wherein one of the at least two monomer gasses is a halocarbon; and one of the at least two monomer gasses is an organosilicon.

21. The method of claim 20, wherein the halocarbon is hexafluoropropylene oxide and the organosilicon is selected from the group consisting of $D_3$ and $D_4$.

22. The method of claim 17, wherein the copolymer of step b) is formed from the reactive species of steps a) and c).

23. The method of claim 22, wherein the reactive species from step a) is formed from an organosilicon monomer gas, and the reactive species from step c) is formed from a halocarbon monomer gas.

24. The method of claim 22, wherein the reactive species from step a) is formed from a halocarbon monomer gas, and the reactive species from step c) is formed from an organosilicon monomer gas.

25. The method of claim 23 or 24, wherein the halocarbon monomer gas is hexafluoropropylene oxide and the organosilicon monomer gas is selected from the group consisting of $D_3$ or $D_4$.

26. A multilayer halocarbon organosilicon copolymer coating prepared by the method of claim 23 or 24.

27. A multilayer copolymer coating prepared by the method of claim 17.

28. A structure having a fluorocarbon-organosilicon copolymer thin film of less than about 20 microns in thickness thereon; wherein the fluorocarbon is selected from the group consisting of hexafluoropropylene oxide, tetrafluoroethylene, hexafluorocyclopropane, octafluorocyclobutane, perfluorooctanesulfonyl fluoride, octafluoropropane, trifluoromethane, difluoromethane, difluorodichloromethane, difluorodibromomethane, difluorobromomethane, difluorochloromethane, trifluorochloromethane, tetrafluorocyclopropane, tetrachlorodifluorocyclopropane, trichlorotrifluoroethane, and dichlorotetrafluorocyclopropane.

29. The structure of claim 28, wherein the copolymer thin film as a dangling bond density less than about $10^{18}$ spins/$cm^3$.

30. The structure of claim 28, comprising a substrate having the halocarbon organosilicon copolymer thin film thereon.

31. The structure of claim 30, wherein the substrate comprises a microfabrication wafer.

32. A structure comprising a razor blade with a blade edge having a halocarbon organosilicon copolymer thin film thereon, wherein said film is less than about 20 microns in thickness.

33. The structure of claim 32, wherein the halocarbon organosilicon copolymer thin film on the razor edge is of less than about 1 micron in thickness.

34. The structure of claim 33, wherein the halocarbon organosilicon copolymer thin film on the razor edge is of less than about 0.1 micron in thickness.

35. A structure comprising a neural probe having a substantially cylindrical shaft portion of a diameter less than about 100 microns and a tip portion that is of a diameter less than about 15 microns and that is connected to the cylindrical shaft portion by a tapered shaft portion, the tapered shaft and the cylindrical shaft portions of the probe having a fluorocarbon-organosilicon copolymer thin film thereon, wherein said film is less th about 20 microns in thickness.

36. A structure comprising a length of wire at least a portion of which has a fluorocarbon-organosilicon copolymer thin film thereon, wherein said film is less than about 20 microns in thickness.

37. The structure of claim 36, wherein the length of wire comprises a plurality of entwined wires.

38. A structure comprising a ribbon cable having a fluorocarbon-organosilicon copolymer thin film thereon, wherein said film is less than about 20 microns in thickness.

39. A method for forming a polymer thin film on a surface of a structure, comprising the steps of:

exposing a vaporized vinyl siloxane and a vaporized initiator to a source of heat having a temperature sufficient to initiate polymerization of the vinyl siloxane in the vicinity of a structure surface on which a polymer thin film is to be formed; and maintaining the structure surface at a substantially lower temperature an that of the heat source to induce deposition and polymerization of the reactive species on the structure surface.

40. The method of claim 39, wherein the vinyl siloxane is 1,3,5-trivinyl-1,3,5-trimethylcyclotrisiloxane.

41. The method of claim 39, wherein the vinyl siloxane is 1,3,5,7-tetravinyl-1,3,5,7-tetramethylcyclotetrasiloxane.

42. The method of claim 39, wherein the initiator is perfluorooctane sulfonyl fluoride.

43. The method of claim 39, wherein the vinyl siloxane is 1,3,5-trivinyl-1,3,5-trimethylcyclotrisiloxane, and the initiator is perfluorooctane sulfonyl fluoride.

44. The method of claim 39, wherein the heat source to which the vinyl siloxane and initiator are exposed comprises a resistively-heated conducting filament suspended above the structure surface.

45. The method of claim 39, wherein the heat source temperature is between about 623K and 813K, and wherein the step of maintaining the structure surface temperature comprises maintaining the structure surface at a temperature les than about 300K.

46. The method of claim 39, wherein the structure comprises a length of wire.

47. The method of claim 39, wherein the structure comprises a neural probe.

48. The method of claim 39, wherein the structure comprises a razor blade.

49. The method of claim 39, wherein the structure comprises a microstructure having multiple surfaces all of which are maintained at a substantially lower temperature than that of the heat source.

50. A structure having a 1,3,5-trivinyl-1,3,5-trimethylcyclotrisiloxane polymer thin film thereon; wherein said structure is selected from the group consiting of razor blade, wire and neutral probe.

51. The structure of claim 50, wherein the structure is a wire.

52. The structure of claim 50, wherein the structure is a razor blade.

53. The structure of claim 50, wherein the structure comprises neural probe.

* * * * *

UNITED STATES PATENT AND TRADEMARK OFFICE
CERTIFICATE OF CORRECTION

| | | |
|---|---|---|
| PATENT NO. | : 6,887,578 B2 | Page 1 of 1 |
| APPLICATION NO. | : 10/282905 | |
| DATED | : May 3, 2005 | |
| INVENTOR(S) | : Karen K. Gleason et al. | |

It is certified that error appears in the above-identified patent and that said Letters Patent is hereby corrected as shown below:

In column 1, lines 13-15, replace:

"This invention was made with support provided by the National Institutes of Health (Contract NO1-NS-9-2323); therefore, the government has certain rights in the invention."

with

--This invention was made with government support under grant number N01 NS092323 awarded by the National Institutes of Health. The government has certain rights in this invention.--

Signed and Sealed this
Fifth Day of July, 2011

David J. Kappos
*Director of the United States Patent and Trademark Office*